United States Patent
Hua et al.

(10) Patent No.: US 6,372,291 B1
(45) Date of Patent: Apr. 16, 2002

(54) IN SITU DEPOSITION AND INTEGRATION OF SILICON NITRIDE IN A HIGH DENSITY PLASMA REACTOR

(75) Inventors: Zhong Qiang Hua, Santa Clara; Kasra Khazeni, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/470,561

(22) Filed: Dec. 23, 1999

(51) Int. Cl.[7] .................... C23C 16/00; C23C 16/08; C23C 16/24; H05H 1/24
(52) U.S. Cl. .................... 427/255.28; 427/255.39; 427/255.393; 427/569; 427/578; 427/579; 438/763
(58) Field of Search ............ 427/248.1, 255.1, 427/255.2, 255.3, 255.7, 402; 438/787, 597, 763; 156/643, 626, 646, 657, 659.1, 345

(56) References Cited

U.S. PATENT DOCUMENTS

| | | | |
|---|---|---|---|
| 4,436,584 A | * 3/1984 | Bernacki et al. ............ | 156/634 |
| 5,661,093 A | * 8/1997 | Ravi et al. .................. | 438/763 |
| 5,858,869 A | * 1/1999 | Chen et al. .................. | 438/597 |
| 5,865,896 A | 2/1999 | Nowak et al. ........... | 118/723.1 |
| 5,876,798 A | * 3/1999 | Vassiliev .................. | 427/255.3 |
| 6,165,915 A | * 12/2000 | Jang ........................... | 438/787 |

* cited by examiner

*Primary Examiner*—Timothy Meeks
*Assistant Examiner*—William P. Fletcher, III
(74) *Attorney, Agent, or Firm*—Townsend & Townsend & Crew

(57) ABSTRACT

A method of depositing a dielectric film on a substrate, comprising depositing a silicon oxide layer on the substrate; and treating the dielectric layer with oxygen. A layer of FSG having a fluorine content of greater than 7%, as measured by peak height ratio, deposited by HDP CVD, is treated with an oxygen plasma. The oxygen treatment stabilizes the film. In an alternative embodiment of the invention a thin (<1000 Å thick) layer of material such as silicon nitride is deposited on a layer of FSG using a low-pressure strike. The low pressure strike can be achieved by establishing flows of the process gases such that the pressure in the chamber is between 5 and 100 millitorr, turning on a bias voltage for a period of time sufficient to establish a weak plasma, which may be capacitively coupled. After the weak plasma is established a source voltage is turned on and subsequently the bias voltage is turned off. Silicon nitride layers deposited using the low pressure strike exhibit good uniformity, strong adhesion, and inhibit outgassing from underlying layers.

19 Claims, 16 Drawing Sheets

IN SITU DEPOSITION AND INTEGRATION OF SILICON NITRIDE IN A HIGH DENSITY PLASMA REACTOR

CROSS-REFERENCES TO RELATED APPLICATIONS

This application is related to concurrently filed and commonly assigned patent application entitled "LOW PRESSURE STRIKE IN HDP-CVD CHAMBER" application Ser. No. 09/470,819 having Kasra Khazeni, Michael Cox, Michael Barnes, Huong and Thanh Nguyen listed as co-inventors, hereby incorporated by reference.

BACKGROUND OF THE INVENTION

The present invention relates to a process and apparatus for the deposition of dielectric layers during semiconductor substrate processing. More specifically, the present invention relates to a method for depositing and integrating layers of fluorosilicate glass and silicon nitride in a high-density plasma chemical vapor deposition reactor.

Semiconductor device geometries continue to decrease in size, providing more devices per fabricated wafer and faster devices. Since the introduction of semiconductor integrated circuits several decades ago, integrated circuits have generally followed a trend of more transistors in less space with each new generation of devices. Currently, some devices are being fabricated with less than 0.25 $\mu$m spacing between features. In some cases there is as little as 0.18 $\mu$m spacing between device features. Examples of these features are conductive lines or traces pattered on a layer of metal. Aluminum has been typically used in such traces. Recently, techniques have been developed for depositing traces made of copper. Copper is desirable in such traces as it is a more electrically conductive material than aluminum.

A nonconductive layer of dielectric material, such as a silicon oxide, is often deposited between and over the patterned metal layer. This dielectric layer may serve several purposes, including electrically insulating the metal layer from other metal layers, insulating conductive features within the layer from each other and protecting the metal layer and/or features from physical or chemical damage. As the spacing, or gap, between the conductive features becomes smaller, the capacitance of the resulting devices becomes larger. Increased capacitance can slow down the operation of an integrated circuit. One way to reduce the capacitance is to use an insulating material with a low dielectric constant. Such materials are often referred to as low k dielectrics.

One approach to depositing low dielectrics to fill gaps is to incorporate halogen atoms into a silicon dioxide layer. Examples of Halogen incorporation are described in U.S. patent application Ser. No. 08/548,391, filed Oct. 25, 1995 and entitled "METHOD AND APPARATUS FOR IMPROVING FILM STABILITY OF HALOGEN-DOPED SILICON OXIDE FILMS", and Ser. No. 08/538,696, filed Oct. 2, 1995 and entitled "USE OF SiF$_4$ TO DEPOSIT F-DOPED FILMS OF GREATER STABILITY", both of which are incorporated herein by reference. It is believed that halogen dopants, such as fluorine, lower the dielectric constant of the silicon oxide films because halogens are electronegative atoms that decrease the polarizability of the overall SiOF network. Fluorine doped silicon oxide films are often referred to as fluorinated silicate glass (FSG) films.

The fluorine content generally determines the properties of a layer of FSG such as the dielectric constant. The fluorine content of the FSG is measured with Fourier Transform Infrared Spectroscopy (FTIR) in terms of the ratio the heights of two absorption peaks. The height of a first (SiF) peak generally indicates the presence of Si—F bonds. The height of a second (SiO) peak generally indicates the presence of Si—O bonds. The average fluorine concentration in the FSG is measured by percentage peak height ratio (% PHR) as follows:

$$\% \text{ PHR} = \frac{\text{SiF}}{\text{SiO}} \times 100\%$$

Direct measurement of the fluorine content of the FSG has shown that the % PHR is roughly proportional to the atomic % fluorine (at. % F) in the FSG layer. The at. % F is sometimes approximated by the formula:

at. % F=(% *PHR*)×K, where K is an empirically determined constant. The fluorine concentration (at. % F) can be determined by such methods as secondary ion mass spectroscopy (SIMS), attenuated total reflection (ATR), or elemental analysis.

One way to deposit a dielectric layer is by chemical reaction of gases. Such a deposition process is referred to as chemical vapor deposition (CVD). Thermal CVD processes supply reactive gases to the substrate surface where heat-induced chemical reactions take place to produce a desired film. The high temperatures at which some thermal CVD processes operate can damage metal layers on device structures. Plasma enhanced CVD (PECVD) processes, on the other hand, promote excitation and/or dissociation of the reactant gases by capacitively coupling radio frequency (RF) energy to a reaction zone proximate the substrate surface, thereby creating a plasma of highly reactive species. The high reactivity of the released species reduces the energy required for a chemical reaction to take place and thus lowers the required temperature for such CVD processes. Unfortunately some PECVD processes cause variations in deposition rates according the geometry of the underlying feature. Such phenomena can create voids in the bottoms of the gaps.

Improved gap filling can be obtained with high-density plasma CVD (HDP-CVD) systems. In HDP-CVD, RF coils generate an inductively coupled plasma under low-pressure conditions. The density of such a plasma is greater by approximately two or more orders of magnitude than the density of a capacitively coupled PECVD plasma. It is believed that the lower chamber pressure employed in HDP-CVD systems provides active species with a long mean free path. The long mean free path combined with the high density allows a significant number of plasma constituents to reach even the deepest portions of closely spaced gaps, providing a film with excellent gap filling capabilities. The high density associated with HDP-CVD also promotes sputtering during deposition. The sputtering is believed to slow the deposition at the top of the gap and thus keep the gap from closing prematurely.

Unfortunately there are some problems associated with FSG layers separating copper conductive traces. One problem is that copper is highly diffusive in dielectric materials such as FSG. Furthermore, a poorly formed FSG layer may absorb moisture from the atmosphere or from reaction products associated with the deposition process. Copper diffusion and moisture absorption can be prevented by depositing a thin layer of silicon nitride (Si$_3$N$_4$) on top of an FSG or between the FSG layer and the copper layer. The silicon nitride acts as a diffusion barrier. Copper has a diffusion length in silicon nitride of between approximately 150 and 200 angstroms. Thus a $Si_3N_4$ layer 200 angstrom thickness or greater is sufficient to prevent diffusion of copper into a dielectric layer underlying, or overlying, the $Si_3N_4$. Unfortunately, fluorine tends to outgas from the FSG at temperatures of about 350 C. The outgassing fluorine forms "bubbles" in an overlying $Si_3N_4$ layer. The bubbles may then lead to delamination of the $Si_3N_4$.

One typical sequence for depositing thin films using HDP-CVD has been to flow argon into the chamber, then strike an argon plasma at a pressure of approximately 40 millitorr. Once the plasma is struck, the pressure in the chamber is reduced to about 5 millitorr (for example, by opening a throttle valve) and then deposition gases are introduced to the chamber to deposit the film. Unfortunately, for the first few seconds of deposition by this method, the deposition gases do not flow evenly since each gas nozzle may be at a different pressure. Deposition starts immediately if the plasma is already on when deposition gases start to flow. Thus, the initial burst of gases with the plasma already on causes a non-uniform initial layer a few hundred angstroms in thickness. Non-uniformity of the film is usually determined by measuring the thickness of the film at a number of (e.g., 49) equidistant points and taking the width of the resulting thickness distribution at half of maximum. A thin film deposited as set forth above typically exhibits, within about 10 seconds of striking the plasma, a non-uniformity of about 4.75%. The non-uniformity might decrease to about 3.5% after about 30 seconds and slowly increase to about 4% after about 60 seconds.

This is not generally a problem with thick films (i.e., greater than about 1000 Å) since thickness of the initial non-uniform layer is usually a small percentage of the total film thickness. For example, suppose a 10,000-Å thick film has a 300 Å thick non-uniform initial layer. The non-uniform initial layer constitutes only 3 percent of the total film thickness. However, for a film less than 1000 Å in thickness, the same 300 Å non-uniform layer comprises 30 percent or more of the thickness of the entire film. Such non-uniformity is often undesirable in a cap layer.

Therefore a need exists in the art for a stable low dielectric constant FSG film with a silicon nitride cap layer that strongly adheres at high temperatures and a concomitant method of depositing same.

SUMMARY OF THE INVENTION

The method of the present invention overcomes the disadvantages of the prior art by depositing a silicon oxide layer (e.g., FSG) on a substrate; and treating the dielectric layer with oxygen prior to forming a silicon nitride cap over the layer. The oxygen treatment stabilizes the FSG. In one embodiment of the invention a layer of FSG having a fluorine content of greater than about 7%, as measured by peak height ratio, is deposited by HDP CVD, and treated with an oxygen plasma. A thin (<1000 Å thick) layer of silicon nitride is deposited on a layer of FSG using a low-pressure strike as described more fully below.

The first dielectric may be deposited by flowing a silicon containing, fluorine containing and oxygen containing gases a deposition chamber, generating a first plasma and depositing the first dielectric layer with the first plasma. The second dielectric layer may be deposited by flowing one or more process gases to a deposition chamber, performing a low pressure strike to initiate a plasma depositing the second dielectric layer with second plasma. The low pressure strike can be achieved by establishing flows of the process gases such that the pressure in the chamber is between 5 and 100 millitorr, turning on a bias voltage for a period of time sufficient to establish a weak plasma. The weak plasma may be capacitively coupled. After the weak plasma is established a source voltage is turned on and subsequently the bias voltage is turned off.

Alternatively, a low dielectric constant film may be formed by depositing a fluorosilicate glass (FSG) with a first atomic ratio of fluorine to oxygen, treating the FSG to reduce the ratio of fluorine to oxygen, and subsequently depositing silicon nitride on top of said FSG layer. Preferably, the FSG deposition, oxygen treatment, and silicon nitride deposition are all performed in the same chamber without removing the substrate from the chamber.

In an alternative embodiment, the low dielectric constant film is formed with a layer of FSG between two layers of silicon nitride. Each silicon nitride layer is formed using a low-pressure strike and the FSG layer is treated with oxygen to enhance stability of the film.

The various versions of the present invention may be embodied as a program code for controlling a semiconductor wafer processing system. The program code may be stored in a suitable computer readable storage medium. The program code can be configured to control a deposition apparatus comprising: a deposition chamber, a gas panel coupled to the chamber, a plasma generating system coupled to the chamber, and a controller coupled to the gas panel, the source power supply and the bias power supply. The controller typically contains the computer readable storage medium having the program code.

Films deposited according to the various embodiments of the present invention exhibit low dielectric constant, good thermal stability, and strong adhesion. Furthermore, process integration can be enhanced by depositing both films by HDP-CVD in situ. The embodiments of the method are particularly useful in copper damascene applications.

DESCRIPTION OF THE SPECIFIC EMBODIMENTS

I. Introduction

Embodiments of the method of the present invention deposit a stable multilayer dielectric film having a low dielectric constant. The film is stabilized by treatment with oxygen and capped with a uniform layer of silicon nitride less than 1000 Å thick. Specific embodiments of the method of the present invention deposit fluorinated silicon glass (FSG). The fluorine content of the FSG is measured with Fourier Transform Infrared Spectroscopy (FTIR) in terms of % PHR. The SiF peak is typically at a wave number of about 890 $cm^{-1}$. The SiO peak is typically at a wave number of about 1040–1100 $cm^{-1}$. The fluorine concentration in the FSG is measured by percentage peak height ratio (% PHR) as described above. In a particular embodiment the FSG layer has a fluorine content, as measured by % PHR, of about 7% or greater.

The low-pressure strike provides high uniformity in thin layers by stabilizing the desired gas flows prior to striking the plasma. Both layers can be deposited in-situ using HDP-CVD, thereby enhancing process integration.

II. Exemplary Substrate Processing System

Figure 1A:
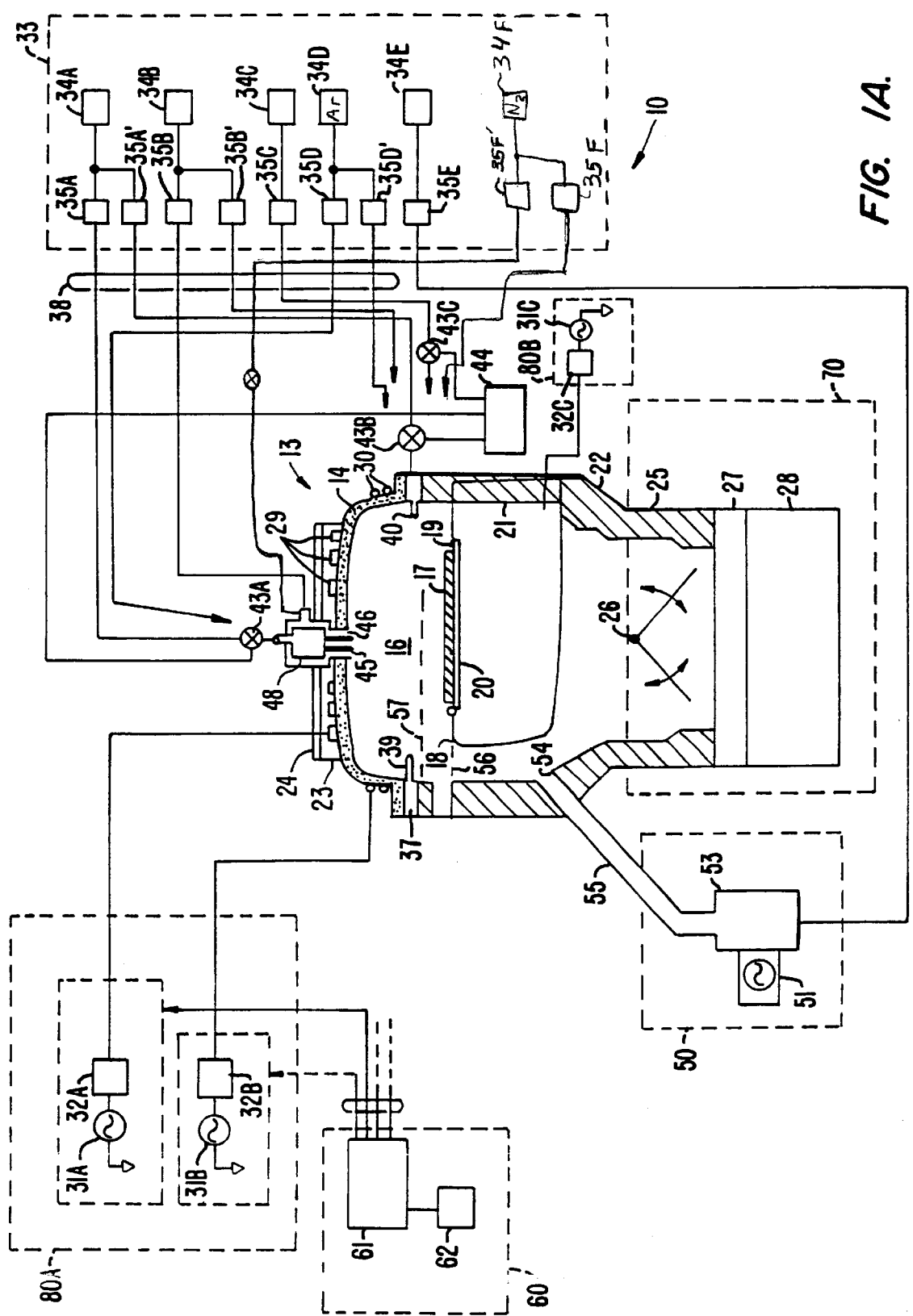
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material. The substrate support member 18 is generally equipped with heating and cooling elements for regulating the temperature of the substrate 17. For example, substrate support member 18 may contain a heating element such as a resistive heater. Alternatively, substrate 17 may be heated, in whole or in part, by energetic bombardment with ions from a plasma within chamber 13. Substrate support member 18 often contains a heat exchange element such as conduit for cooling fluids. Substrate receiving portion 19 may include grooves or channels for distributing a heat transfer medium such as backside gas (e.g., helium). The heat transfer medium has a higher thermal conductivity than the vacuum it replaces thereby facilitating heat transfer between substrate support 18 member and the substrate 17.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping, as described in co-pending, co-assigned U.S. patent application Ser. No. 08/574,839, filed Dec. 12, 1995, and which is incorporated herein by reference. Gate valve 27 can isolate pump 28 from throttle body 25, and can also control chamber pressure by restricting the exhaust flow capacity when throttle valve 26 is fully open. The arrangement of the throttle valves, gate valve, and turbomolecular pump allow accurate and stable control of chamber pressures from between about 1 millitorr to 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. Generally, BRF generator 32C is coupled to substrate support member 18, or a bias electrode within substrate receiving member 19 or electrostatic chuck 20. The bias plasma system 80B serves to enhance the transport of plasma species (i.e., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator, and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
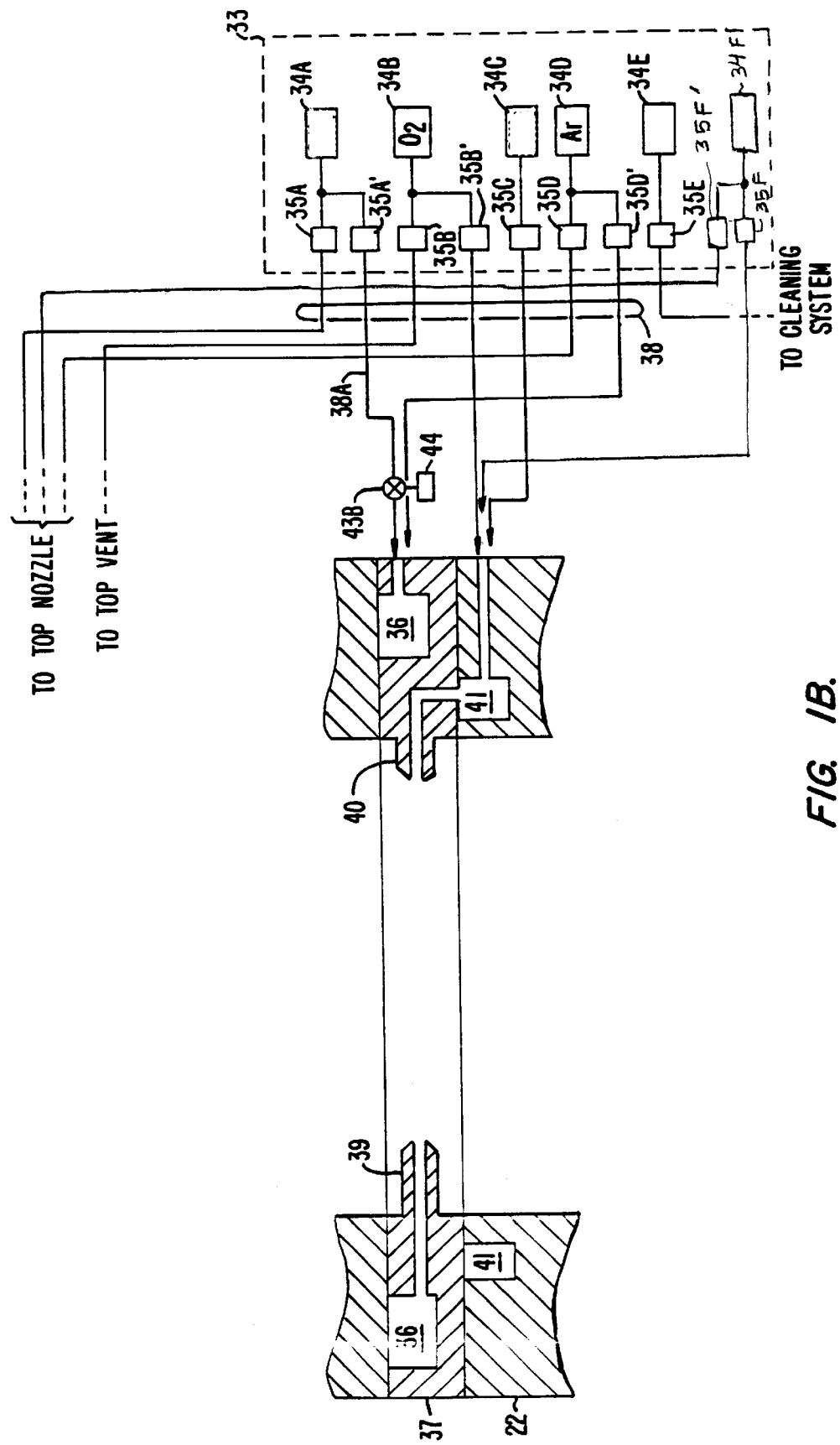
FIG. 1B is a simplified cross section of a gas ring that may be used in conjunction with the exemplary CVD processing chamber of FIG. 1A.

A gas delivery system 33 provides gases from several sources, 34A–34F, to the chamber for processing the substrate via gas delivery lines 38 (only some of which are shown). As would be understood by a person of skill in the art, the actual sources used for sources 34A–34F and the actual connection of delivery lines 38 to chamber 13 depends in part on the process that occurs in chamber 13. Gases are introduced into chamber 13 through a gas ring 37 and a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) via gas flow controller 35F to the oxidizer nozzles 40 of the gas ring to the chamber for process steps utilizing nitrogen plasma. Alternatively, the nitrogen gas could be delivered to the chamber through other or additional inlets, such as the top nozzle 45 via gas flow controller 35F'. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines, such as 35A and 35C. Such 3-way valves may be placed as close to chamber 13 as practical, to minimize the volume of the unvented gas delivery line (between the 3-way valve and the chamber). Additionally, two-way (on-off) valves (not shown) may be placed between an MFC and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle mass flow controller (MFC) 35A' controls the amount of silane delivered to source gas nozzles 39 and top nozzle MFC 35A controls the amount of silane delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E, such as molecular fluorine, nitrogen trifluoride, other fluorocarbons or equivalents, in reactor cavity 53. The reactive species resulting from this plasma are conveyed to chamber 13 through cleaning gas feed port 54 via applicator tube 55. The materials used to contain the cleaning plasma (e.g. cavity 53 and applicator tube 55) must be resistant to attack by the plasma. The distance between reactor cavity 53 and feed port 54 should be kept as short as practical, as the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in an in situ plasma. Consequently, relatively sensitive components, such as electrostatic chuck 20, do not need to be covered, with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 60 operates under the control of a computer program stored on the hard disk drive or other computer programs, such as programs stored on a floppy disk. The computer program dictates, for example, the timing, mixture of gases, RF power levels and other parameters of a particular process. The interface between a user and the system controller is via a monitor, such as a cathode ray tube (CRT), 65, and a light pen 66, as depicted in FIG. 1C.

Figure 1C:
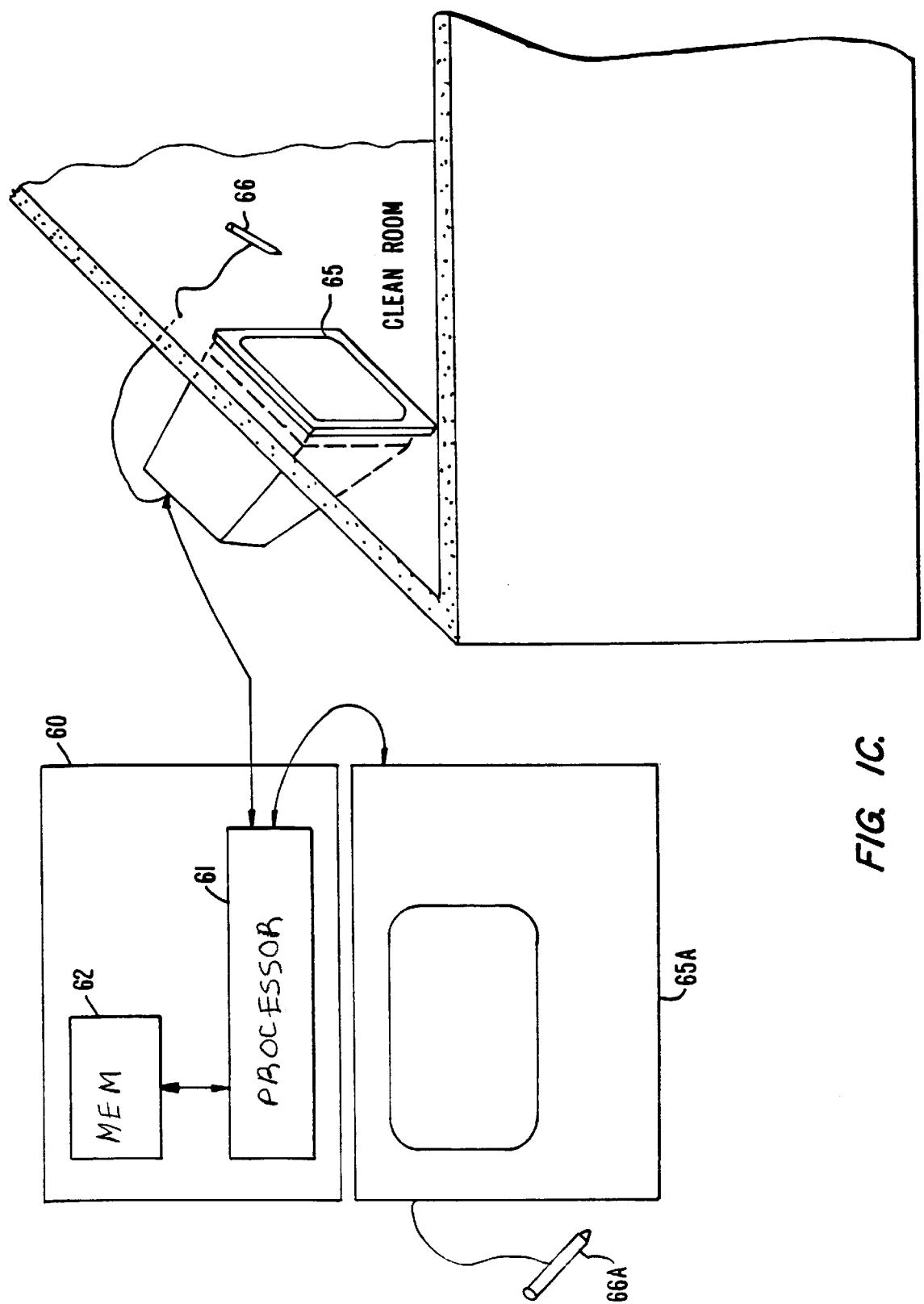
FIG. 1C is a simplified diagram of a monitor and light pen that may be used in conjunction with the exemplary CVD processing chamber of FIG. 1A.

FIG. 1C is an illustration of a portion of an exemplary system user interface used in conjunction with the exemplary CVD processing chamber of FIG. 1A. System controller 60 includes a processor 61 coupled to a memory 62. Preferably, memory 62 may be a hard disk drive, but of course memory 62 may be other kinds of memory, such as ROM, PROM, EPROM CD-ROM, tape drive, floppy disk drive and others.

System controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The area touched confirms being selected by the light pen by changing its color or displaying a new menu, for example.

The computer program code can be written in any conventional computer readable programming language such as 68000 assembly language, C, C++, or Pascal or other language. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1D:
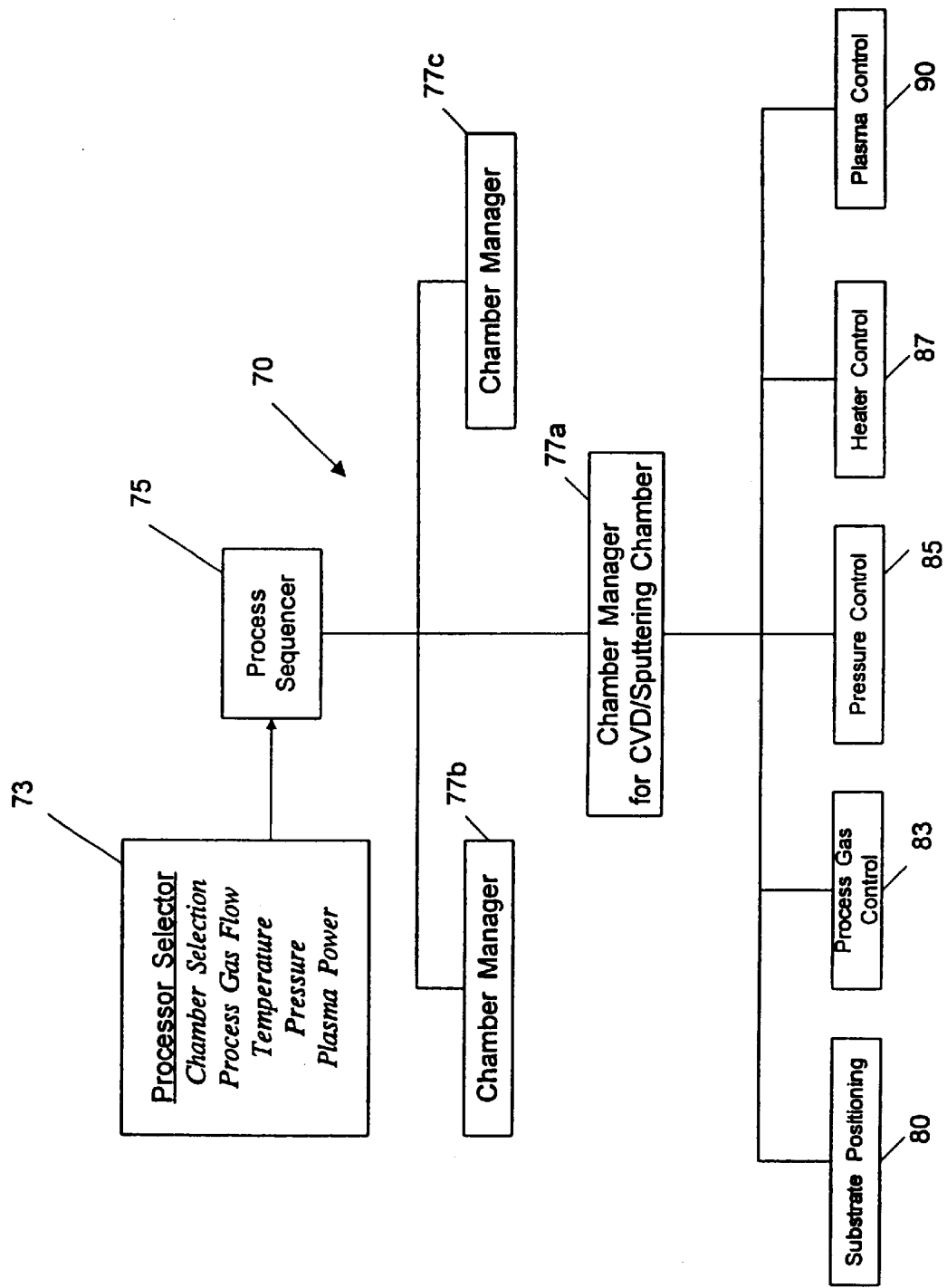
FIG. 1D is a flow chart of an exemplary process control computer program product used to control the exemplary CVD processing chamber of FIG. 1A.

FIG. 1D shows an illustrative block diagram of the hierarchical control structure of computer program 70. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. Process selector subroutine 73 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of system controller 60.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so sequencer subroutine 75 operates to schedule the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 75 determines which process chamber and process set combination is going to be executed next, sequencer subroutine 75 causes execution of the process set by passing the particular process set parameters to a chamber manager subroutine 77a–77c, which controls multiple processing tasks in various processing chambers, (not shown) according to the process set determined by sequencer subroutine 75. In particular, chamber manager subroutine 77a controls a CVD chamber such as HDP-CVD chamber 13 of FIG. 1A.

Examples of chamber component subroutines are substrate positioning subroutine 80, process gas control subroutine 83, pressure control subroutine 85, heater control subroutine 87, and plasma control subroutine 90. Those having ordinary skill in the art will recognize that other chamber control subroutines can be included depending on what processes are desired to be performed in chamber 13. In operation, chamber manager subroutine 77a selectively schedules or calls the process component subroutines in accordance with the particular process set being executed. Scheduling by chamber manager subroutine 77a is performed in a manner similar to that used by sequencer subroutine 75 in scheduling which process chamber and process set to execute. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. Substrate positioning subroutine 80 comprises program code for controlling chamber components that are used to load a substrate onto substrate support number 18. Substrate positioning subroutine 80 may also control transfer of a substrate into chamber 13 from, e.g., a PECVD reactor or other reactor in the multichamber system, after other processing has been completed.

Process gas control subroutine 83 has program code for controlling process gas composition and flow rates. Subroutine 83 controls the open/close position of the safety shut-off valves, and also ramps up/down the mass flow controllers to obtain the desired gas flow rates. All chamber component subroutines, including process gas control subroutine 83, are invoked by chamber manager subroutine 77*a*. Subroutine 83 receives process parameters from chamber manager subroutine 77*a* related to the desired gas flow rates.

Typically, process gas control subroutine 83 operates by opening the gas supply lines, and repeatedly (i) reading the necessary mass flow controllers, (ii) comparing the readings to the desired flow rates received from chamber manager subroutine 77*a*, and (iii) adjusting the flow rates of the gas supply lines as necessary. Furthermore, process gas control subroutine 83 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 83 is programmed to include steps for flowing the inert gas into chamber 13 for an amount of time necessary to stabilize the pressure in the chamber. The above-described steps may then be carried out.

Additionally, when a process gas is to be vaporized from a liquid precursor, for example, tetraethyloxysilane (TEOS), the process gas control subroutine 83 may include steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters.

Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 83 may also control the flow of heat-transfer gas, such as helium (He), through the inner and outer passages in the wafer chuck with an independent helium control (IHC) subroutine (not shown). The gas flow thermally couples the substrate to the chuck. In a typical process, the plasma and the chemical reactions that form the layer heat the wafer, and the He cools the substrate through the chuck, which may be water-cooled. This keeps the substrate below a temperature that may damage preexisting features on the substrate.

Pressure control subroutine 85 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer for example, and throttle valve 26 position may be adjusted according to pressure control subroutine 85, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 85 is invoked, the desired, or target, pressure level is received as a parameter from chamber manager subroutine 77*a*. Pressure control subroutine 85 operates to measure the pressure in chamber 13 by reading one or more conventional pressure manometers connected to the chamber, compare the measure value(s) to the target pressure, obtain proportional, integral, and differential (PID) values from a stored pressure table corresponding to the target pressure, and adjust throttle valve 26 according to the PID values obtained from the pressure table. Alternatively, pressure control subroutine 85 may open or close throttle valve 26 to a particular opening size to regulate the pressure in chamber 13 to a desired pressure or pressure range.

Heater control subroutine 87 includes program code for controlling the temperature of substrate 17 and/or the temperature in the chamber 13. There are at least two basic methods of controlling the chamber temperature. The first method relies on characterizing the substrate temperature as it relates to, among other things, the total power delivered by the plasma. The first method adjusts the level of source RF power and/or bias RF power. Increasing the power level generally increases the substrate temperature. Decreasing the power level generally decreases the substrate temperature. The first method may also be used to control the temperature of chamber 13.

Alternatively, the chamber or substrate temperature may be measured, with a thermocouple or pyrometer for example, and the temperature controlled with a separate temperature control unit. Such a temperature control unit may comprise heater elements, cooling elements or both. Such heating/cooling elements may be coupled to the substrate support member 18, the chamber 13 or both. Some chambers include a separate temperature control unit for the dome 14.

When temperature control subroutine 87 is invoked, the desired, or target, pressure level is received as a parameter from chamber manager subroutine 77*a*. Temperature control subroutine 87 operates to measure the temperature of chamber 13 and or substrate 17 by reading one or more conventional temperature sensors connected to the chamber and/or substrate, compare the measure value(s) to a target temperature, obtain proportional, integral, and differential (PID) values from a stored pressure table corresponding to the target pressure, and adjust some combination of source RF generator 31A, bias RF generator 31B and chamber/substrate heating/cooling elements, according to the PID values obtained from the pressure table. Alternatively, temperature control subroutine 87 may set source RF generator 31A and/or bias RF generator 31B to particular power levels to regulate temperature of substrate 17 to a desired temperature or temperature range.

Plasma control subroutine 90 comprises program code for controlling the frequency and power output setting of RF generators 31A and 31B, and for tuning matching networks 32A and 32B. Plasma control subroutine 90, like the previously described chamber component subroutines, is invoked by chamber manager subroutine 77a. Those skilled in the art will recognize that where substrate temperature is regulated by control of the plasma, the temperature control subroutine 87 can be incorporated, in whole or in part, within plasma control subroutine 90.

An example of a system which may incorporate some or all of the subsystems and routines described above would be an Ultima System, manufactured by Applied Materials, configured to practice the present invention. The details of such a system are disclosed in U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference.

III. Exemplary Structure

Figure 2:
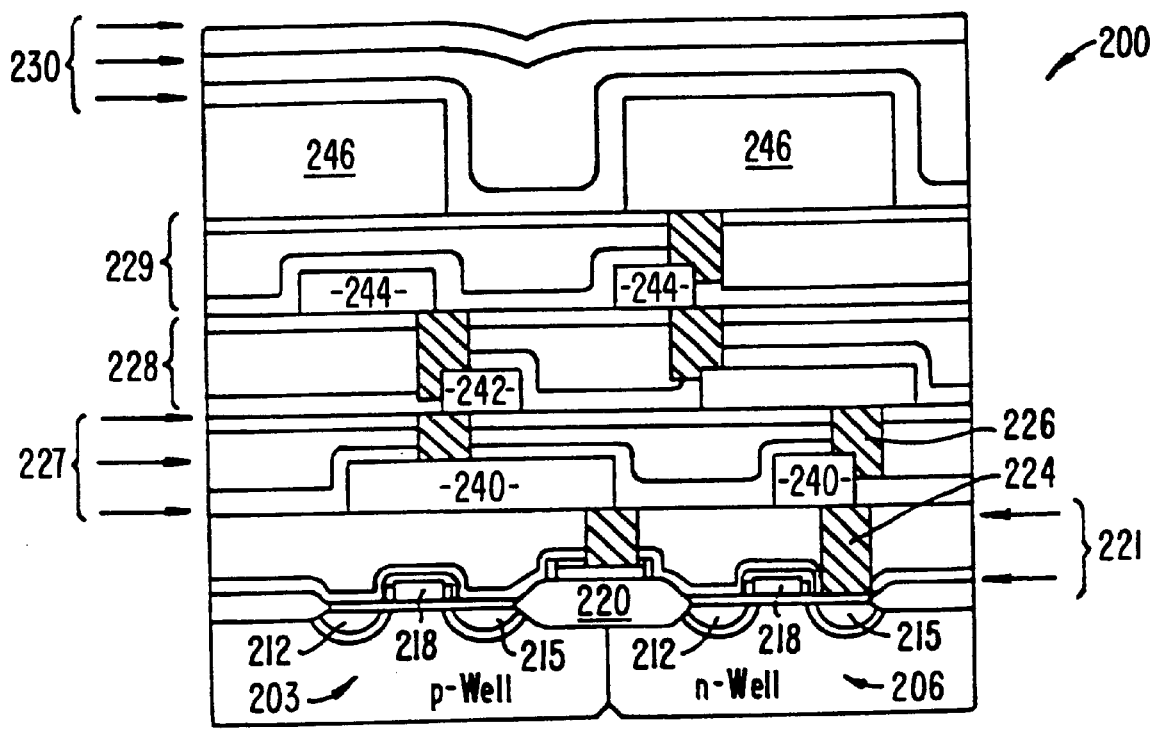
FIG. 2 is a cross sectional diagram of an exemplary structure containing an embodiment of a dielectric layer according to the present invention.

FIG. 2 illustrates a simplified cross-sectional view of an integrated circuit 200 according to the present invention. As shown in FIG. 2, integrated circuit 200 includes NMOS and PMOS transistors 203 and 206, which are separated and electrically isolated from each other by a field oxide region 220. Each of transistors 203 and 206 comprises a source region 212, a drain region 215, and a gate region 118.

A premetal dielectric layer 221 separates transistors 203 and 206 from metal layer 240, with connections between metal layer 230 and the transistors 203, 206 made by contacts 224. Metal layer 240 is, for example, one of four metal layers, 240, 242, 244, and 246 included in integrated circuit 200. Each metal layer is separated from adjacent metal layers by intermetal dielectric (IMD) layers 227,228, and 229 including barrier layers 227a, 228a, 229a, gap-fill layers 227b, 228b, 229b, and cap layers 227c, 228c, 229c. Adjacent metal layers are connected at selected openings by vias 226. Deposited over metal layer 246 are planarized passivation layers 230 including, for example, a barrier layer 230a, a gap fill layer 230b, and a cap layer 230c.

Preferably, at least one of the gap-fill layers 227b, 228b, 229b, and 230b contains FSG that has been treated with oxygen according to a first embodiment of the of the present invention. It is more preferable that at least one of the cap layers 227c, 228c, 229c and 230c is deposited using a low-pressure strike according to a second embodiment of the present invention. It is most preferable to deposit a cap layer according to second embodiment over a gap-fill layer treated with oxygen according to the first embodiment.

The layer of the present invention may find uses in each of the dielectric layers shown in integrated circuit 200. The layer of the present invention may also be used in damascene layers, which are included in some integrated circuits. In damascene layers, a blanket layer is deposited over a substrate, selectively etched through to the substrate, and then filled with metal and etched back or polished to form metal contacts such as 224. After the metal layer is deposited, a second blanket deposition is performed and selectively etched. The etched areas are then filled with metal and etched back or polished to form vias such as 226.

It should be understood that the simplified integrated circuit 100 is for illustrative purposes only. One of ordinary skill in the art could implement the present method for fabrication of other integrated circuits, such as microprocessors, application- specific integrated circuits (ASICs), memory devices, and the like.

IV. Exemplary Low-Dielectric Constant Film

Dielectric films deposited in accordance with embodiments of the present invention generally have a low dielectric constant. Low dielectric constant herein refers to a dielectric constant that is less than a dielectric constant for an undoped silicon oxide film. Generally, silicon oxide ($Si_xO_y$) has a dielectric constant k of about 4. Films with k less than 4 are referred to as low-k films. Films with k greater than 4 are referred to as high-k films. A low dielectric constant can result from fluorine atoms that are incorporated in a silicon oxide layer of the film to form a layer of fluorsilicate glass (FSG). Such a dielectric film may be used as an intermetal dielectric (IMD) layer or other type of dielectric layer. The specific example below describes an IMD layer formed over copper traces, which may be as close together as 0.25 microns and have an aspect ratio of at least 4:1. The film includes a thin silicon nitride layer that strongly adheres to the FSG. The silicon nitride layer acts as a diffusion barrier between the copper and the FSG layer. Therefore, this layer not only has a lowered dielectric constant but also has excellent gap-filling properties and is compatible with pre-existing copper structures on a semiconductor substrate.

Figure 3:
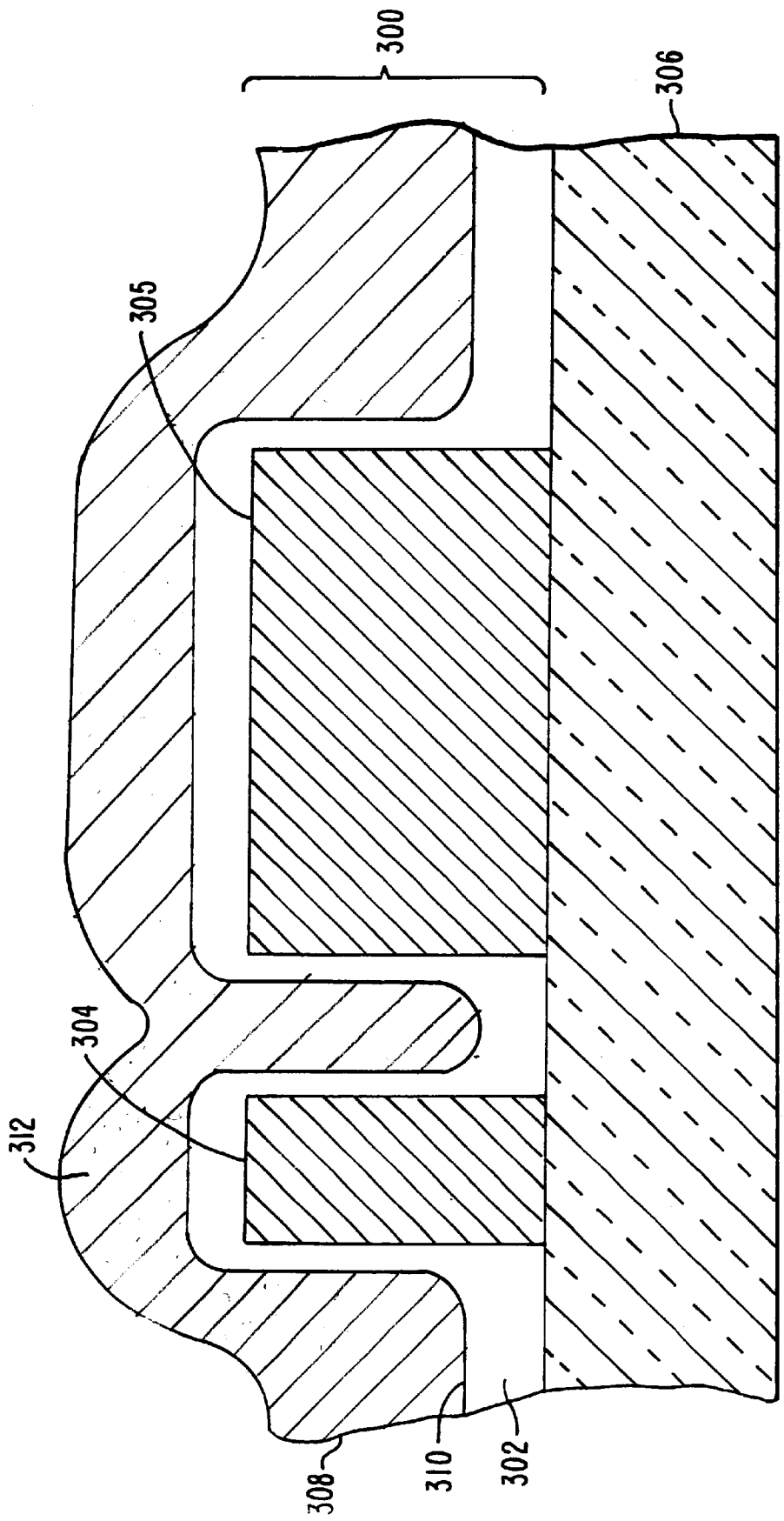
FIG. 3 is a cross sectional diagram of an exemplary low dielectric constant film according to the present invention.

FIG. 3 is a simplified cross-section of an embodiment of the present invention with a two-layer silicon oxide film 300. A HDP-CVD layer 302 of silicon nitride, e.g., $Si_3N_4$, is deposited over the conductive traces 304, 305 and substrate 306. The substrate 306 could be, for example, a silicon wafer or a silicon wafer with existing structures or layers. This silicon nitride layer acts as a diffusion barrier and also is a compressive layer, which improves the reliability of the underlying metal traces, especially with regard to metal cracking and electromigration failures. Silicon nitride layer 302 may be deposited in accordance with the second embodiment of the invention. An HDP-CVD layer 308 of FSG is deposited over the surface 310 of silicon nitride layer 302. Preferably, FSG layer 308 is treated with oxygen 312 after being deposited by conventional HDP-CVD. An optional capping layer 314 may be deposited to seal the FSG layer and provide a surface that is compatible with typical subsequent semiconductor processes. Preferably capping layer 314 is a silicon nitride layer deposited in accordance with the second embodiment of the invention.

V. Deposition of Low Dielectric Constant Films

Figure 4:
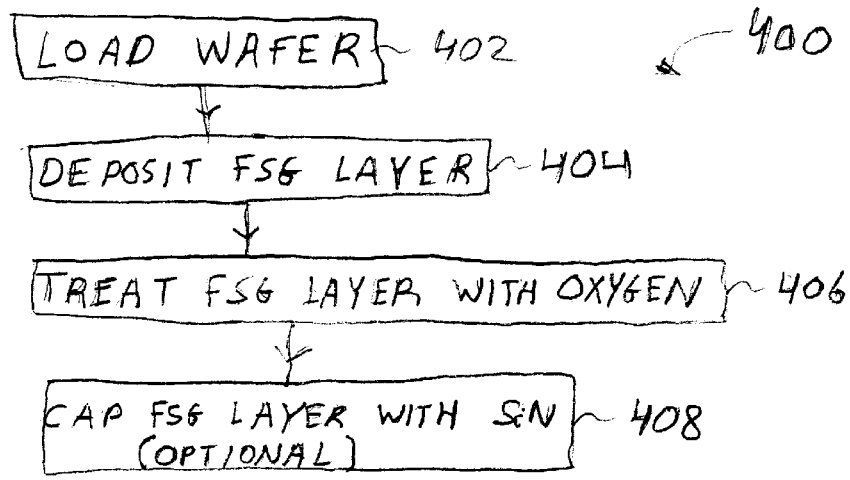
FIG. 4 is a flow diagram of an embodiment of a method of depositing a low dielectric constant film according to the present invention.

FIG. 4 is a flow chart of one embodiment of a deposition method according to the present invention in which oxygen treatment enhances the stability of a FSG layer. In this embodiment, the processing is accomplished within a single processing chamber, but it is understood that the process could be adapted to a multichamber system, or could be performed in a series of different chambers or systems. Similarly, the process parameters described below are for an 8-inch process wafer, but the process could be modified to accommodate other wafers such as 10-inch wafers.

A wafer is loaded onto the substrate support member in the processing chamber (step 402) through a vacuum-lock door, or slit valve, and moved to the desired processing position. A process gas including a silicon source, a fluorine source, and an oxygen source is introduced into the chamber and a high density plasma is formed to deposit a layer of FSG (step 404) over the wafer. In a preferred embodiment, the silicon source is monosilane ($SiH_4$), the fluorine source is tetrafluorosilane ($SiF_4$) which can also be considered a silicon source, and the oxygen source is diatomic oxygen ($O_2$). Alternatively, TEOS or other silanes, having the general formula $Si_xH_y$, such as disilane ($Si_2H_6$), trisilane ($Si_3H_8$), tetrasilane ($Si_4H_{10}$), can be used as the silicon source. Similarly, other gases such as $F_2$ may be substituted as the fluorine source. Ozone ($O_3$) can be used as an alternative oxygen sources. The plasma may optionally include an inert gas such as helium or argon. It generally easier to strike a plasma in argon than in helium. Other inert gases such as Neon, Krypton, or Xenon may be also used, although Krypton and Xenon tend to be more expensive than Helium and Argon.

The gases are provided at a flow rates of between 90 and 94 standard cubic centimeters per minute (sccm) for $SiF_4$, between 50 and 54 sccm for $SiH_4$ and between 155 and 165 sccm for $O_2$. Gas flow rates are more preferably about 94 standard cubic centimeters per minute (sccm) for $SiF_4$, 50 sccm for $SiH_4$, and 160 sccm for $O_2$. The pressure in the chamber is typically set and maintained at between about 3.5 and 6 millitorr, preferably about 4 millitorr. The plasma may be formed by the application of either single- or mixed-frequency RF power. Typically SRF generator 31A provides RF power top coil 29 at a frequency of between about 1.7 and 1.9 Hz, preferably about 1.8 Hz to at a power level of between about 800 and 1000 W, preferably at about 800 W. SRF generator 31B provides RF power at a frequency of between 2.0 MHz and 2.1 MHz to side coil 30 at between about 2500 and 3500 W, preferably about 3000 W. Bias RF power is provided to the substrate 17 at a frequency of about 13.56 MHz and a power of between about 800 W and 2000 W, preferably between about 1800 W. The wafer temperature is typically maintained at between 380° C. and 400° C. The chamber temperature is typically maintained at between about 70 and 75° C., preferably about 75° C.

The above process conditions are maintained for a sufficient period of time to form a FSG layer about 6,000 Å to 12,000 Å thick, preferably about 8,000–10,000 Å thick. Actual deposition times are dependent on the chamber used. By way of example, the exemplary chamber of FIG. 1*a*–1*d* can deposit an FSG layer 8000 Å thick in about 90 seconds using the above parameters. At this stage, an FSG film deposited under the above conditions, has a relatively high atomic ratio of fluorine to oxygen. In a preferred embodiment, the FSG layer has a fluorine concentration, as measured by % PHR, of between about 7.8% and about 8.0% before treating the FSG layer with oxygen. Typically the $O_2/Si$ ratio is between about 1.0 to 1.2 preferably about 1.1. The $O_2/Si$ ratio generally depends on the flow rates of $O_2$, $SiF_4$ and $SiH_4$ as follows:

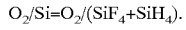

$O_2/Si=O_2/(SiF_4+SiH_4)$.

Generally, the $SiF_4/SiH_4$ flow rate ratio is between about 1.7 and 1.8, preferably about 1.75. The actual flow rates will depend upon the chamber used.

The dielectric constant k, and index of refraction n, of the FSG layer depend on the atomic percent of fluorine in the FSG film. Generally, the greater the fluorine content, the lower the values of k and n. An FSG film having a fluorine content of 0 at. %, i.e., undoped silicate glass (USG), typically has a k value of about 4 and an index of refraction of about 1.46. If the FSG film is doped with fluorine to 10 at. % the index of refraction is between 3.4 and 3.7 and the index of refraction is between about 1.40 and 1.43. Dielectric constants for films are usually determined by capacitance and voltage (C–V) probe measurements of the deposited film and a reference film of known k value.

In addition to the above-described method for depositing FSG, several different processes for forming fluorinated silicon glass (FSG) are known. One alternative process uses triethoxyfluorosilane (TEFS) with tetraethyloxysilane (TEOS) in a PECVD deposition process. Another alternative process for forming an FSG film uses $C_2F_6$ as the fluorine source in a PECVD process. Such FSG deposition processes are described in U.S. patent application Ser. No. 09/075,592, assigned to Applied Materials.

After forming the FSG layer, the surface of the FSG layer is treated with oxygen (step 406) to reduce the fluorine to oxygen ratio. Oxygen treatment can be accomplished, for example, by heating the FSG layer during exposure to oxygen or ozone, bombardment with energetic oxygen ions or energetic neutral oxygen atoms. In a preferred embodiment, the FSG layer is bombarded with oxygen ions from a plasma in the same chamber 13 in which the FSG was deposited. Generally the $SiF_4$ and $SiH_4$ flows are stopped at the end of FSG deposition while the oxygen flow rate remains approximately the same as it was in step 404. Plasma is maintained using approximately the same power and frequency settings for source RF used during deposition. The Bias RF frequency typically has the same value during oxygen treatment as during FSG deposition, however the BRF power is typically increased by roughly one third more than the value used during deposition. In a more preferred embodiment, the BRF power is between about 1500 W and 1800 W during oxygen treatment.

During oxygen treatment, the wafer temperature is maintained at about 420° C. The chamber pressure is maintained at about 1.8 to 2.5 mTorr, preferably about 2 mTorr, for a period between about 10 seconds and 1 minute, preferably about 20 seconds. A high throughput of wafers through the processing system is desirable, therefore the period of treatment should be kept as short as possible, while still providing sufficient oxygen treatment. The exact time required will depend on many factors, including the how the preceding HDP-CVD process was performed. The oxygen penetrates into the FSG layer where it reacts with the fluorine to make the resulting film more stable. The FSG layer has a fluorine concentration, as measured by % PHR, of between about 7.5% and about 7.8% after treatment with oxygen.

Optionally, a silicon nitride cap layer may be deposited over the FSG layer (step 408). The cap layer is not necessary to achieve the lower dielectric constant of the underlying layer, but may make the FSG layer more compatible with subsequent integrated circuit processing steps. The FSG layer may be planarized or densified prior to the formation of a cap layer. The cap layer may be formed using a HDP-CVD process similar to the process described above. However, in order to control the deposition of very thin films, i.e., 1000 Å or less, a special low-pressure strike is required to initiate the plasma.

VI. Deposition of Cap Layer Using Low Pressure Strike

It is advantageous to deposit a thin cap layer of silicon nitride over the FSG film. In damascene applications, silicon nitride deposited on copper can serve as a barrier to diffusion of copper into an overlying or underlying layer. Alternatively, silicon nitride deposited on a dielectric layer, such as FSG, can serve as an etch stop. A thin layer of silicon nitride is desirable since silicon nitride has a k-value of about 7 compared to 3.4 for FSG containing about 10 atomic percent F. The effective dielectric constant of a composite dielectric film depends on the thickness and dielectric constant of each layer comprising the film. Generally, for a film comprised of two layers having, respectively, dielectric constant $k_1$ and $k_2$ and thickness $d_1$ and $d_2$, the effective dielectric constant $k_{eff}$ for the film depends on the thickness and dielectric constant for each layer. Typically, the thicker layer has a greater influence on the effective dielectric constant of the film. Thus, although silicon nitride has a much larger dielectric constant than FSG, if the silicon nitride layer is sufficiently thin compared to the overall film thickness, the effective dielectric constant of the film can be made close to that of FSG.

Figure 5:
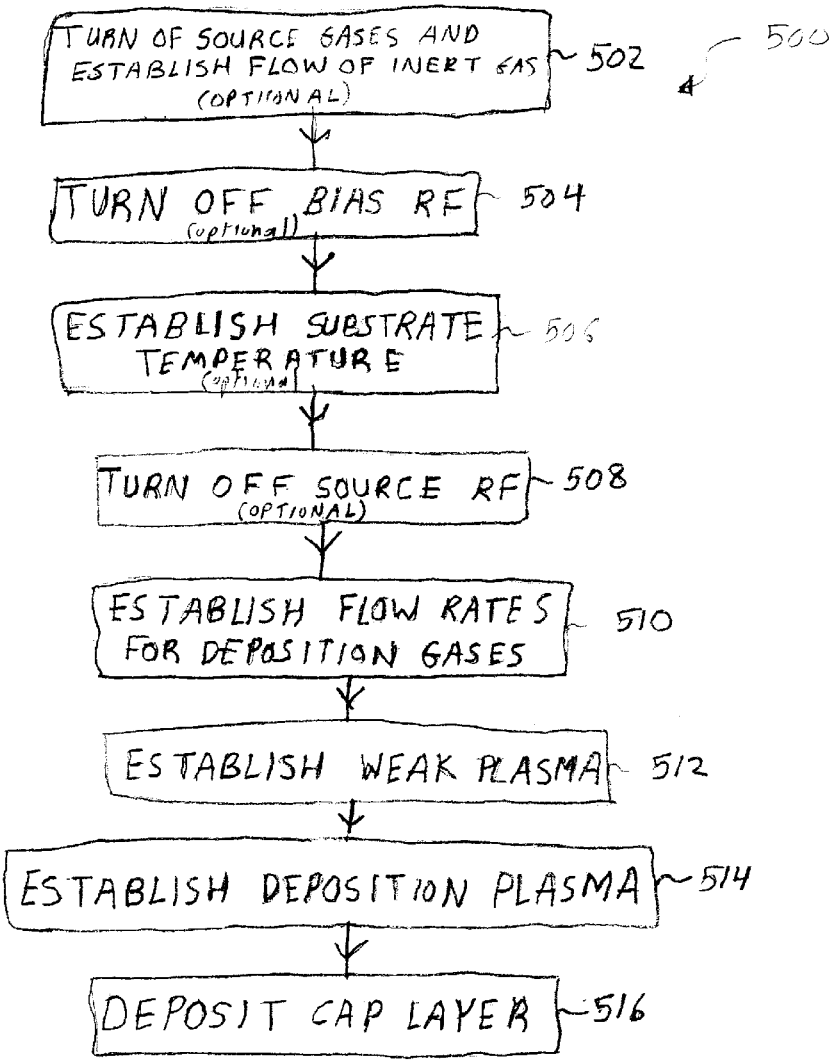
FIG. 5 depicts a flow diagram of an embodiment a method of depositing a cap layer according to the present invention.

In addition to being thin, the silicon nitride layer must typically also be uniform. To deposit a uniform thin silicon nitride layer after deposition of FSG it is often desirable to strike the plasma with the deposition gases flowing. FIG. 5 depicts a flow diagram of an embodiment of a method of depositing a cap layer of the present invention employing a low pressure strike. The low pressure strike method is described fully in commonly assigned U.S. Patent Application titled "LOW PRESSURE STRIKE IN HDP-CVD CHAMBER", attorney docket number AMAT/3272/PDD/KPU3/JW, filed concurrently with the present application and incorporated herein by reference. The embodiment of the method depicted in FIG. 5 is the preferred embodiment of step 408 of FIG. 4. The method 500 begins after step 406 of FIG. 4, i.e., the oxygen treatment of the FSG layer as described above. Alternatively, the cap layer may be deposited by the method 500 after step 404. The method begins at step 502 by turning off the sources of fluorine, silicon and oxygen. Any flow of inert gas, however, is maintained. If no inert gas was used in the prior step, a flow of inert gas is established prior to shutting off the other gases. Thus, a plasma of inert gas is established in the chamber. In a preferred embodiment, the inert gas is Argon, provided at a flow rate of between 180 and 200 sccm of. The source RF is generally maintained at a frequency of between 1.8 Hz and 2.07 Hz, for the top and side coils respectively. The source RF power is maintained at between approximately 4000 W and 5000 W, preferably about 4500 W. The bias RF is turned off at step 504 to reduce the kinetic energy with which ions from the inert plasma bombard the film.

The substrate temperature is established at step 506. For a cap layer of silicon nitride ($Si_xN_y$) a substrate temperature of about 430° C. is typically established prior to deposition. The inert plasma alone may be used to heat the substrate, e.g., by exposing the substrate to the plasma. The duration of the exposure depends on the required temperature rise for the substrate. Generally the hotter the substrate, the less time required to heat it. To enhance throughput, it is generally advantageous to deposit the cap layer as soon as possible after the underlying layer is deposited, i.e., when the wafer is already hot. For example, if the cap layer is to be deposited immediately after FSG deposition, the substrate is already quite hot. Under these circumstances, exposing the substrate to the inert plasma for about 10 seconds is usually sufficient to heat the substrate to the desired temperature for cap layer disposition. Alternatively, a heating element in the substrate support may be used alone or in conjunction with the plasma to heat the substrate. Once the desired temperature for deposition is established, the source RF is turned off at step 508 while the inert gas still flows. Without the source RF there is no plasma in the chamber. At the moment the source RF is turned off, deposition gases are introduced to the chamber to mix with the inert gas. For a $Si_xN_y$ cap layer the deposition gases typically include a silicon source and a nitrogen source. In a preferred embodiment, the silicon source is $SiH_4$ and the nitrogen sources is diatomic nitrogen ($N_2$) Alternatively, other organosilanes, such as $Si_2H_6$ may be used as the silicon source and other nitrogen containing gases such as ammonia ($NH_3$) may be used as the nitrogen source.

At step 510 the flow rates of deposition gases are established. In the preferred embodiment of $Si_xN_y$ deposition, the $SiH_4$ flow rate is between 16 and 20 sccm and the $N_2$ flow rate is between 230 and 270 sccm. Typically, it is necessary to wait between 3 and 6 seconds for the mass flow controllers in the gas delivery system to establish their set point flow rates. The exact amount of time depends on the individual mass flow controllers in the gas delivery system. Chamber pressure is also established at this time. For a low-pressure strike, the chamber pressure is typically between 1 and 100 millitorr. Preferably, the chamber pressure is below about 40 millitorr. For silicon nitride deposition, the pressure in the chamber is typically between 4 and 7 millitorr at this stage.

It should be pointed out here that steps 502, through 508 are optional. These steps are used in the specific case where a low-pressure strike is employed to deposit a cap layer in-situ immediately after deposition of an underlying layer in the same chamber. Alternatively, the low-pressure strike method may commence with the stabilization of gas flow rates and chamber pressure as in step 510.

Once the flow rates and chamber pressure are stabilized, a weak plasma is established in the chamber at step 512. Generally, for pressures below about 40 millitorr, it is easier to establish a capacitively coupled plasma than an inductively coupled plasma. After the weak plasma is established, the source RF is turned on to establish a deposition plasma at step 514. By weak plasma, it is meant that the plasma power is sufficiently low to avoid damage to devices formed on the substrate. Such a weak capacitively coupled plasma may be established by applying a direct current (D.C.) or RF bias to substrate support member 18 to establish an electric field. In one specific embodiment, the capacitively-coupled weak plasma is established by turning on the substrate bias (e.g., (BRF generator 31C) at a power of between 300 W and 1000 W for a bias period of up to 1.0 second, typically between 0.5 and 1.0 seconds. The actual power is, to a certain extent dependent upon the size of substrate being processed. For example, with a 200-mm substrate the bias power is preferably between 1500 and 2000 watts, more preferably about 1800 W. The corresponding power density is preferably between about 4.8 W/cm$^2$ and 6.4 W/cm$^2$, more preferably about 5.7 W/cm$^2$. For larger or smaller substrates the bias power density as in approximately the same range and the bias power scales in approximate proportion to the wafer surface area.

Once the weak plasma is established, the source RF is turned on to establish the deposition plasma in step 514 and the substrate bias is turned off as soon as possible after the source RF is turned on. If the substrate bias is turned off before the source RF is turned on the plasma will usually be undesirably extinguished. Thus, there is usually some overlapping period during which both source RF and bias RF are turned on. Generally this overlapping period typically comprises roughly the latter half of the bias period. For example, if the substrate bias is turned on for a bias period of 0.5 to 1.0 seconds, the Source RF is turned on for a period of time that overlaps the last 0.25 to 0.5 seconds that the substrate bias is turned on. Generally, it is desirable to make the bias period and overlapping period as short as possible. The lower limit for the bias period and overlapping period is usually dependent on the speed of response of the generators and electronics that provide the substrate bias and source RF signals.

The cap layer is deposited at step 516 using the deposition plasma. Generally, the substrate bias is not turned on during silicon nitride deposition. Bias RF is sometimes used during other deposition processes such as silicon oxide. For given gas flow rates and given RF settings, and chamber pressure, the thickness of the deposited cap layer depends largely on the time of deposition. Generally, the longer the deposition time the thicker the film. Since the flow rates of the deposition gases have already been established prior to striking the plasma, the initial deposition is more uniform than in the prior art. Consequently very uniform films of less than 1000-Å thickness can be deposited. In a most preferred embodiment, the flow rates are approximately 200 sccm for Ar, 18 sccm for $SiH_4$, and 250 sccm for $N_2$, the source RF is at a total power of approximately 4500 W, and the chamber pressure between about 7 to 8 mTorr. Under these conditions, deposition times of between 50 seconds and 60 seconds produced $Si_xN_y$ films having thickness of between 800 Å and 1000 Å. Silicon nitride films deposited using a low-pressure strike, as described herein, have exhibited non-uniformities as low as 2.25%. This is substantially more uniform than in the prior art. Furthermore, the non-uniformity of the low-pressure strike deposited film remains approximately constant up to at lease 65 seconds after deposition has begun. Thus, even very thin films (e.g., about 300 Å) deposited using the low-pressure strike are quite uniform.

Although an embodiment of the method of the present invention has been described above with respect to depositing a silicon nitride cap layer of a layer of FSG, other and further embodiments of the invention may be devised without departing from the basic scope thereof. For example, the order of the FSG and silicon nitride deposition steps can be reversed. That is, a thin (<1000 Å) silicon nitride layer could be deposited on a substrate using a low pressure strike as described above with respect to FIG. 5 and then a layer of FSG, or other material, could be deposited on top of the silicon nitride, e.g., using HDP-CVD. The silicon nitride would act as a barrier layer between the FSG and the underlying substrate. Furthermore, another thin silicon nitride layer could be deposited as a cap layer on top of the FSG layer using a second low-pressure strike. Thus, the FSG would be "sandwiched" between two thin layers of silicon nitride effectively inhibiting delamination of the FSG from an underlying substrate and also inhibiting delamination of any layers that overly the FSG. Such "sandwich" structures are desirable, for example, in damascene applications.

VII. Exemplary Damascene Process

Figure 6A:
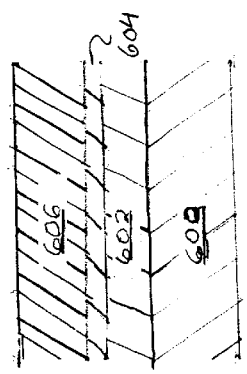
FIGS. 6(a)–6(h) depict a cross-section of a partially formed integrated circuit undergoing an integrated dual-damascene process according to an embodiment of the present invention.
Figure 6B:
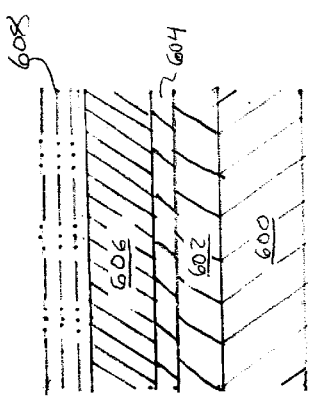
Figure 6C:
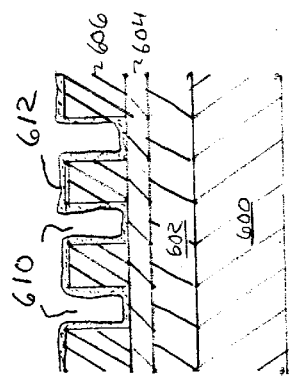
Figure 6D:
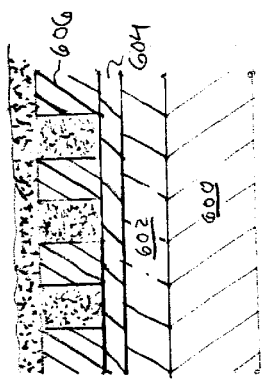

An example of a copper-damascene process integration scheme that utilizes the dielectric film deposition described above is depicted in FIGS. 6(a)–6(h). The dual damascene process begins with the deposition of an oxide layer 602 over a silicon substrate 600 as shown in FIG. 6(a). An etch stop layer 604, is deposited over oxide layer 602 using the silicon nitride deposition process described above, e.g., by HDP-CVD using low pressure strike. A first FSG layer 606 is deposited and covered with a patterned photoresist layer 608 during a first photolithography as shown in FIG. 6(b) First FSG layer 606 may be deposited in the same chamber as etch stop layer 604 to enhance process integration. In FIG. 6(c), a first etch forms a first set of gaps 610 in first FSG layer 606 down to etch stop layer 604. After the first etch, photoresist 608 is stripped, e.g., by washing in an oxidizing environment. Gaps 610 and first FSG layer 606 are then covered with a layer of metal, such as aluminum or copper. In the case of copper, a seed layer 612 (FIG. 6c) is deposited over gaps 610 and first FSG layer 606. In some embodiments, a diffusion barrier layer (not shown) is deposited over the gaps 610 and first FSG layer prior to depositing copper seed layer 612. A first bulk copper layer 614 is deposited over copper seed layer 612 to fill the gaps 610 as shown in FIG. 6(d). Copper layer 614 is planarized, e.g., by CMP. Portions of copper layer 614 that fill gaps 610 form, e.g., a first set of metal lines 615 in an interconnect structure.

Figure 6E:
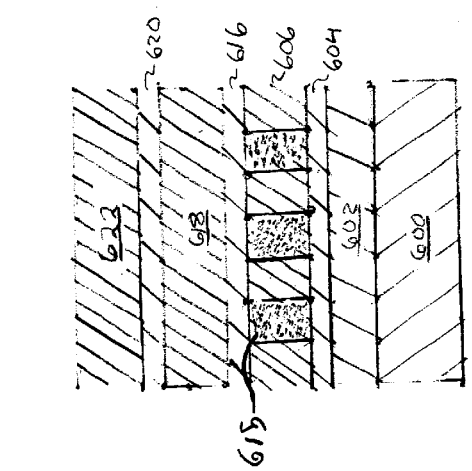
Figure 6F:
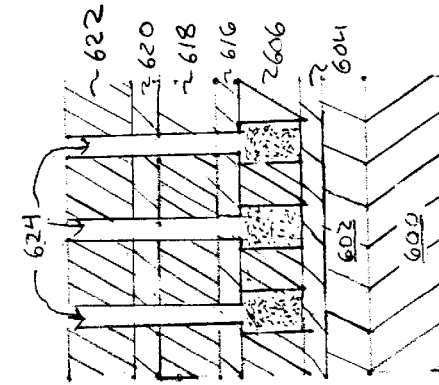
Figure 6G:
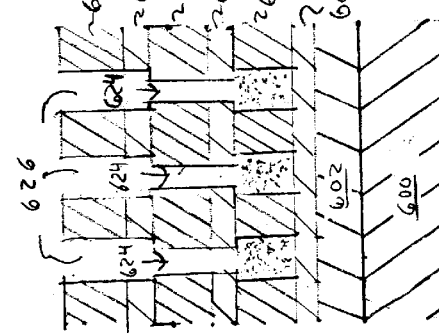
Figure 6H:
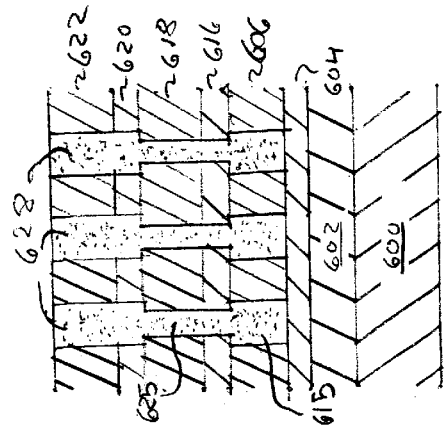

After planarization, of copper layer 614, a barrier layer 616, e.g., silicon nitride, a second FSG layer 618, a second etch stop layer 620 and third FSG layer 622 are deposited as shown in FIG. 6(e). Preferably, barrier layer 618 and etch stop layer 620 are deposited using the low-pressure strike described above. Again, layers 618, 620, and 622 may be deposited in the same chamber, e.g., by HDP-CVD as described above with respect to FIG. 4 and 5, to enhance process integration. A second lithography and etch forms vias 624 through layers 616, 618, 620 and 622 down to copper layer 614 as shown in FIG. 6(f). In FIG. 6g, a third lithography and etch forms a second set of gaps 626. Vias 624 and gaps 626 are then filled with a second bulk copper layer and the resulting structure is annealed and planarized as shown in FIG. 6(h). Gaps 626 define a second set of metal lines 628 and vias 624 define a set of interconnects 625 between the second set of metal lines 628 and the first set of metal lines 615.

Damascene processes are used in devices that use copper interconnects because there is currently no acceptable way to etch copper. Structures formed by damascene processes do not require a gap-fill dielectric and generally provide lower RC delays than similar structures formed using aluminum metal lines. Furthermore, higher deposition rates may be used in damascene processes since gap-fill is not an issue. Although the etch stop and barrier layers are described as being silicon nitride, other materials can be deposited using the low pressure strike deposition described above with respect to FIGS. 3–5.

VIII. Test Results and Measurements

In the experiments low k films having FSG layers were deposited on silicon wafers with and without oxygen treatment. Some films were deposited with a silicon nitride cap layer and without to determine the effect of the low-pressure strike on the adhesive properties of the silicon nitride cap layer. The films in the experiments were deposited in an Ultima™ HDP-CVD chamber manufactured by Applied Materials, Inc. of Santa Clara, Calif. The chamber was outfitted for 200-mm wafers and situated in a Centura® multichamber substrate processing system also manufactured by Applied Materials. Average fluorine content of the FSG layers was measured by % PHR using an ECO RS series FTIR spectrometer manufactured by Nicolet Instrument Corporation of Madison, Wis. Alternatively a Spectrum 2000 FTIR spectrometer manufactured by Perkin-Elmer Corporation of Norwalk, Conn. may be used. The SiO peak typically occurs at a wave number of between about 1090 $cm^{-1}$ and about 2005 $cm^{-1}$, preferably about 1097 $cm^{-1}$. The SiF peak typically occurs at a wave number of between about 930 $cm^{-1}$ and about 940 $cm^{-1}$, preferably about 935 $cm^{-1}$.

The stability of the deposited films was determined by thermal desorption spectroscopy (TDS). A sample was cut from each wafer and placed in a sample tube. The sample tube containing the sample was placed in a TDS machine and heated in a vacuum to progressively higher temperatures, while measuring the concentration of various gases released from the sample. Stability of the films having silicon nitride cap layers was confirmed qualitatively by inspecting for haze or bubble formation. The adhesive properties of the films was determined by a Studd pull test. Films were also tested for stability and adhesive strength by chemical mechanical polishing (CMP). The wafers were stored for between about two weeks and about 2 months under ambient conditions before the TDS measurements.

Figure 7A:
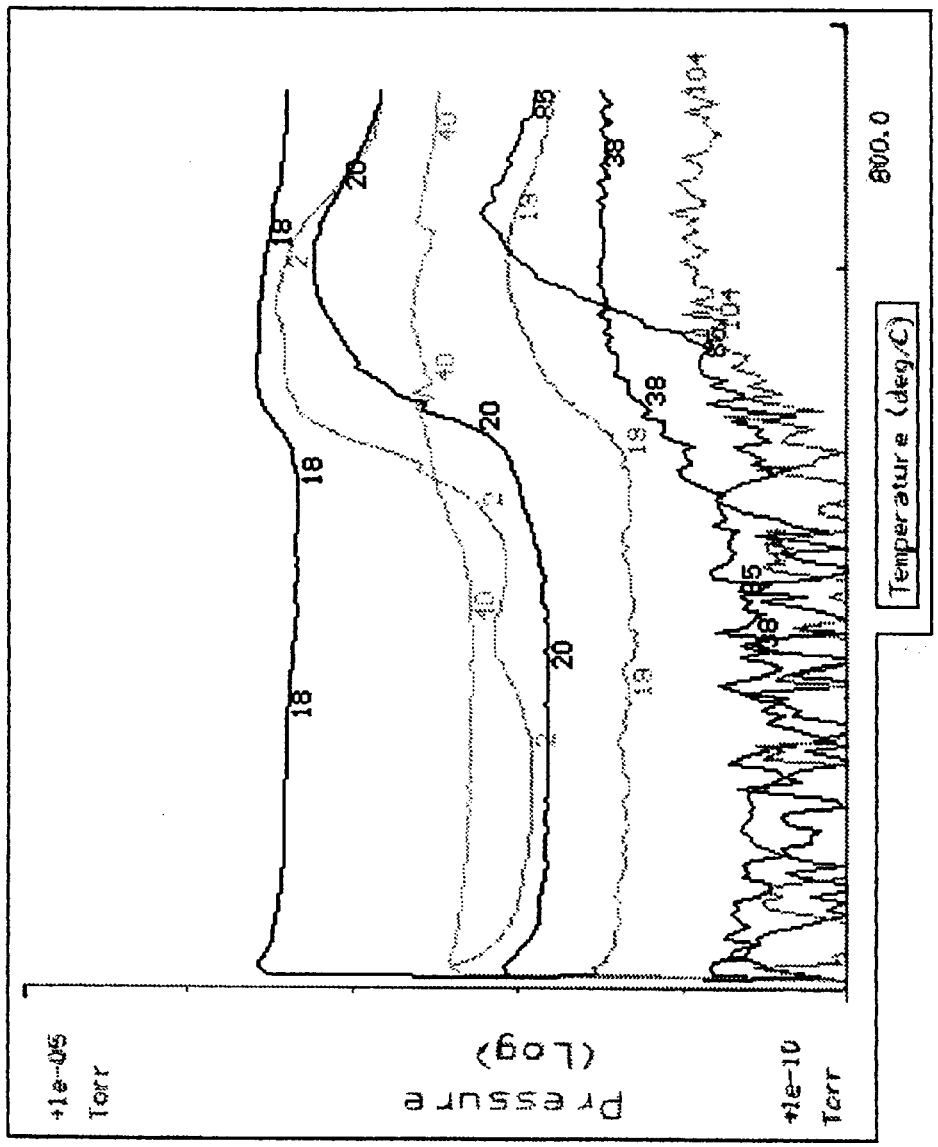
FIGS. 7(a)–7(h) are thermal desorption spectroscopy diagrams for low dielectric constant films.
Figure 7B:
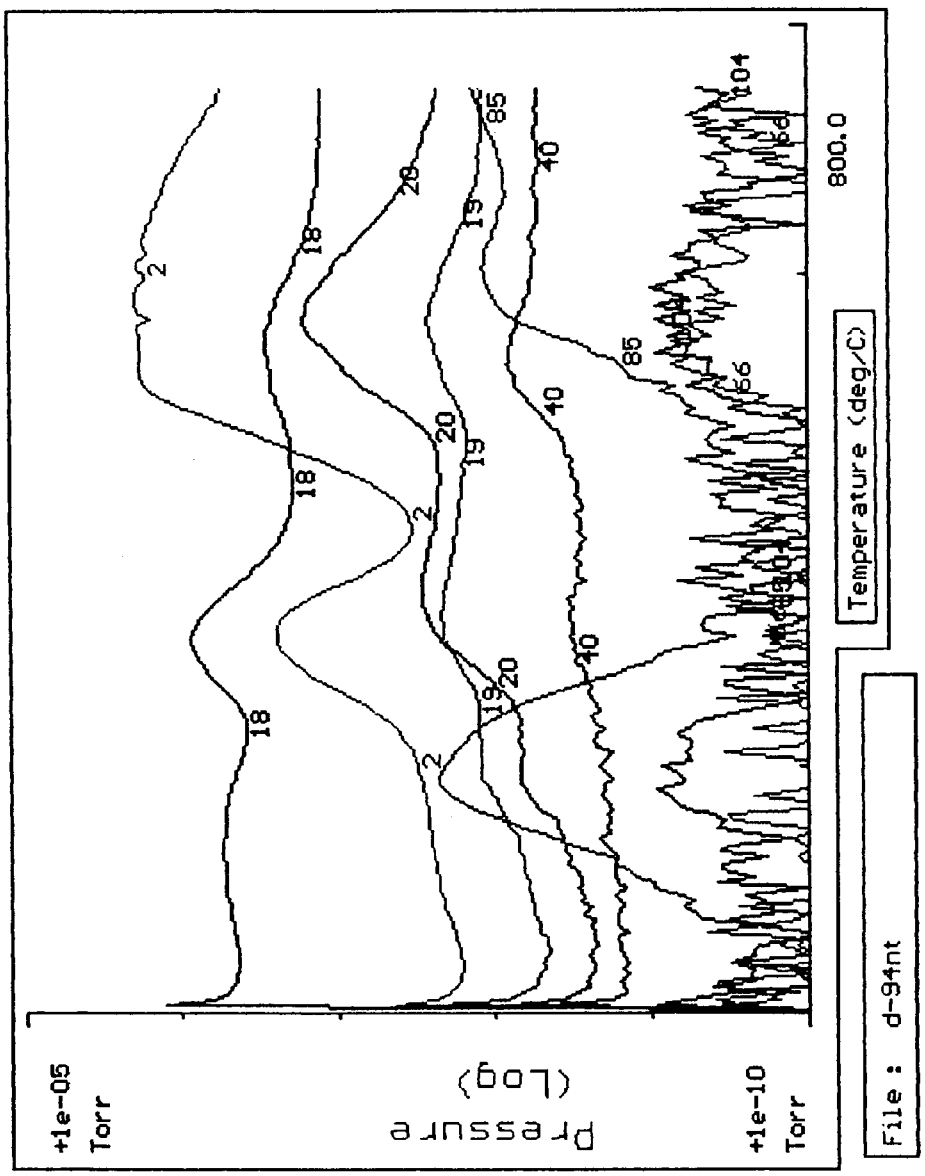
Figure 7C:
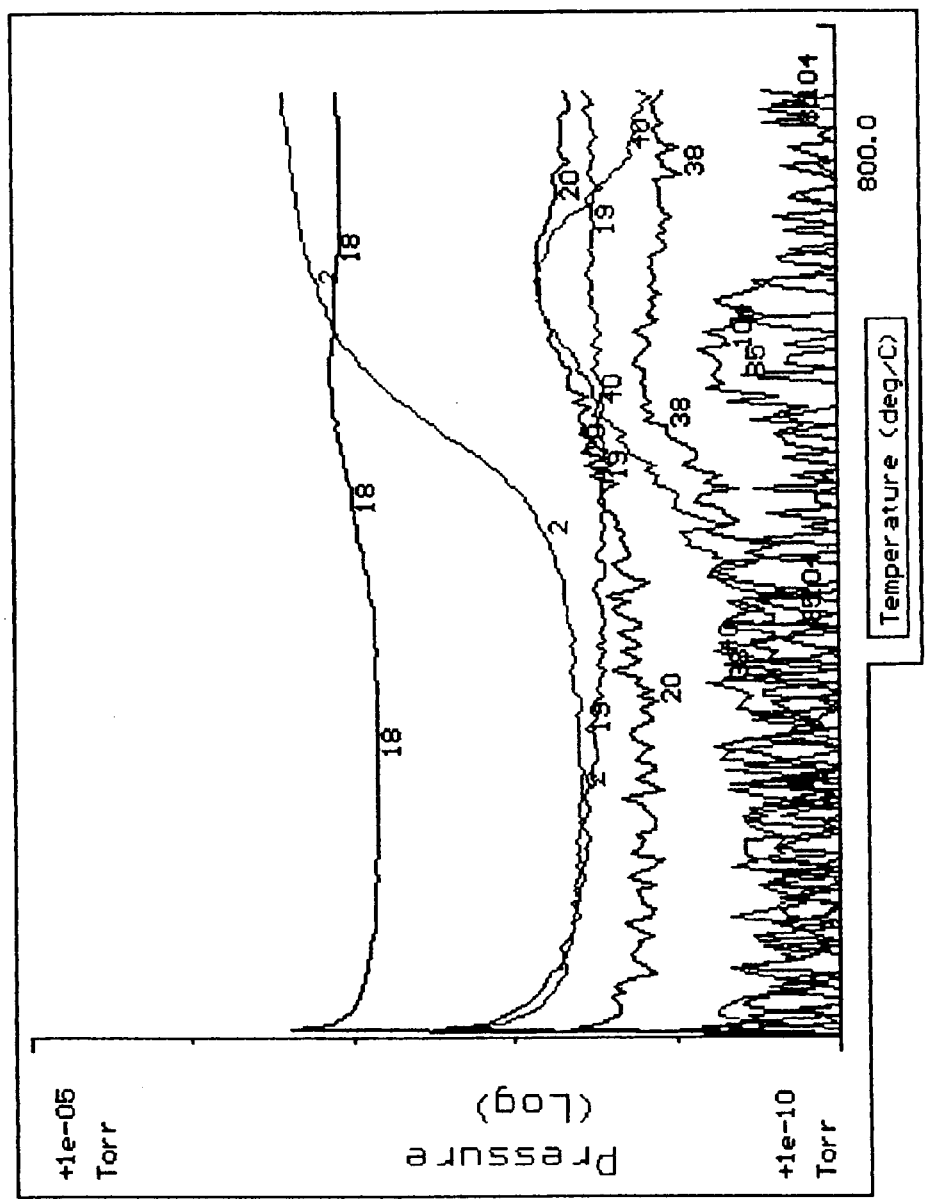
Figure 7E:
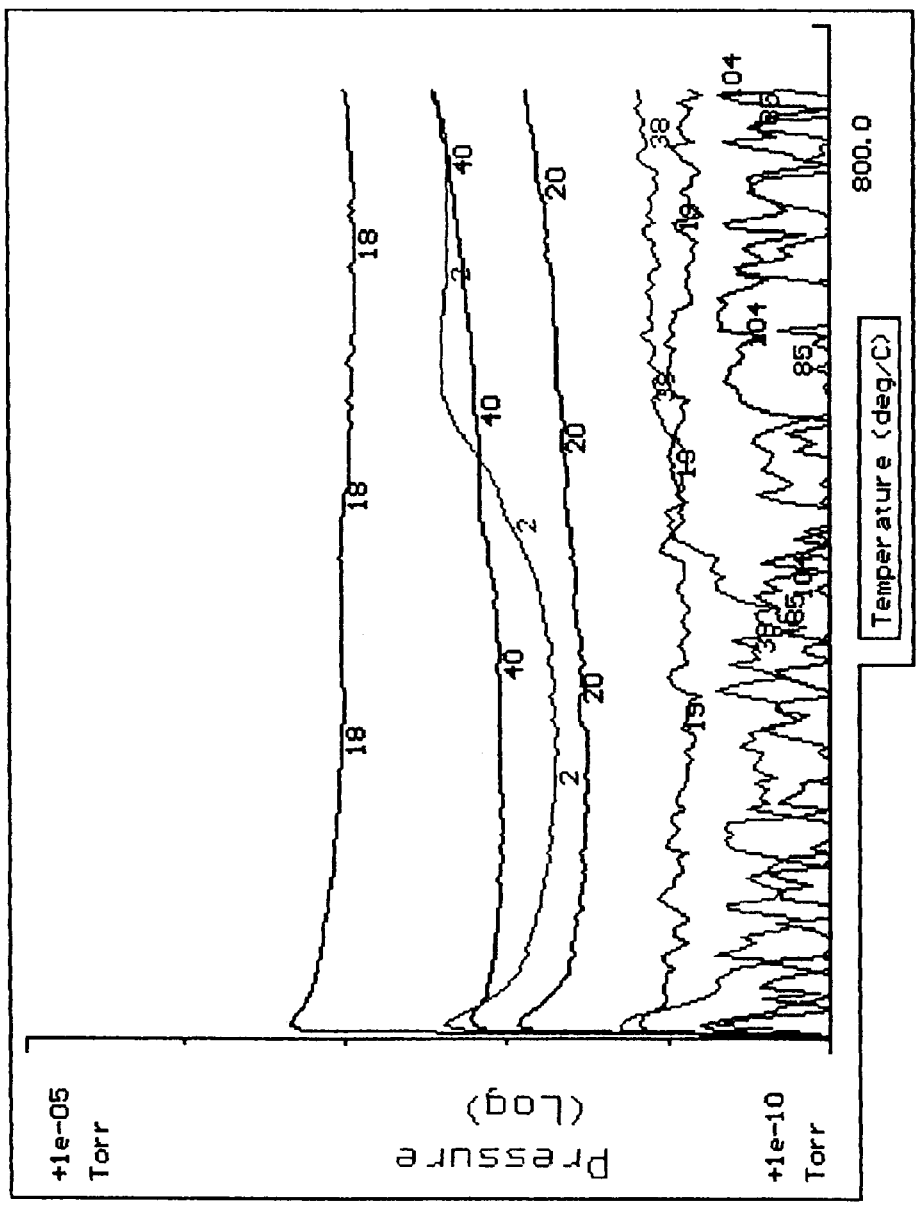
Figure 7E:
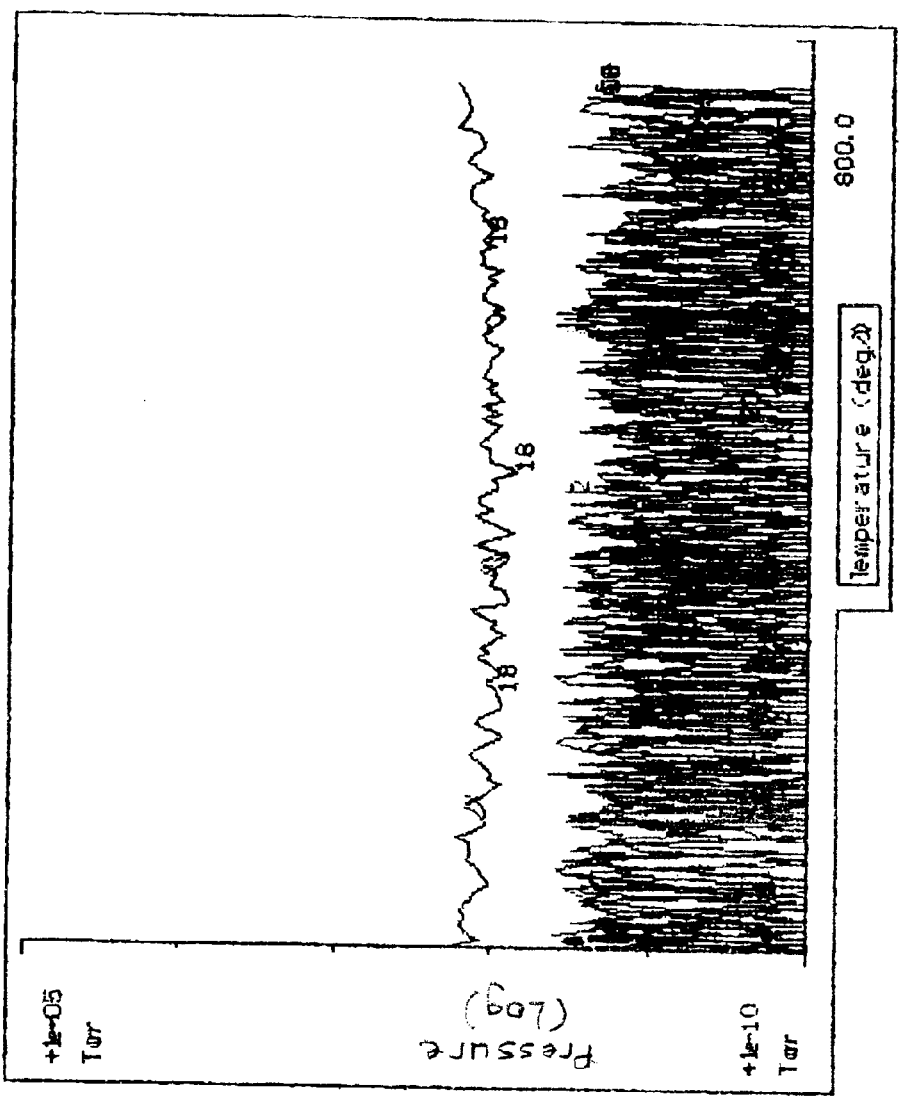
Figure 7:
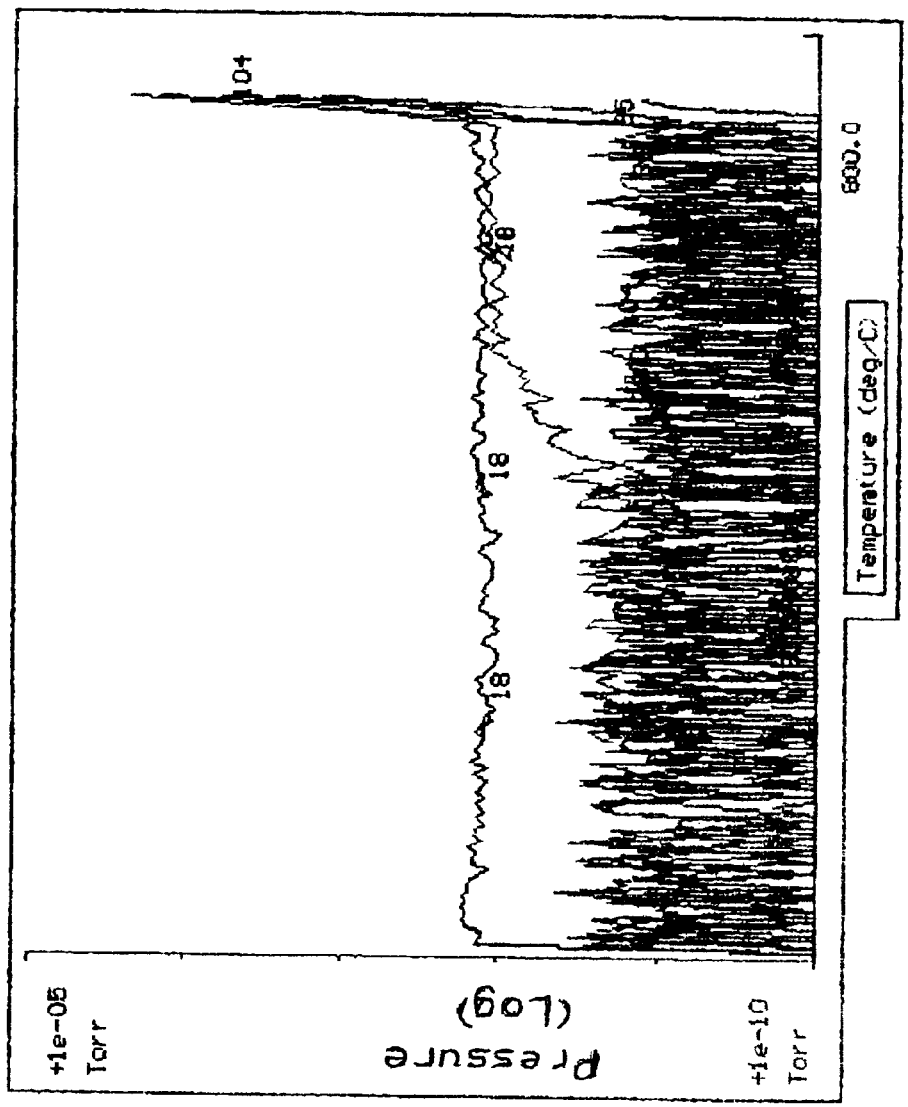
Figure 7G:
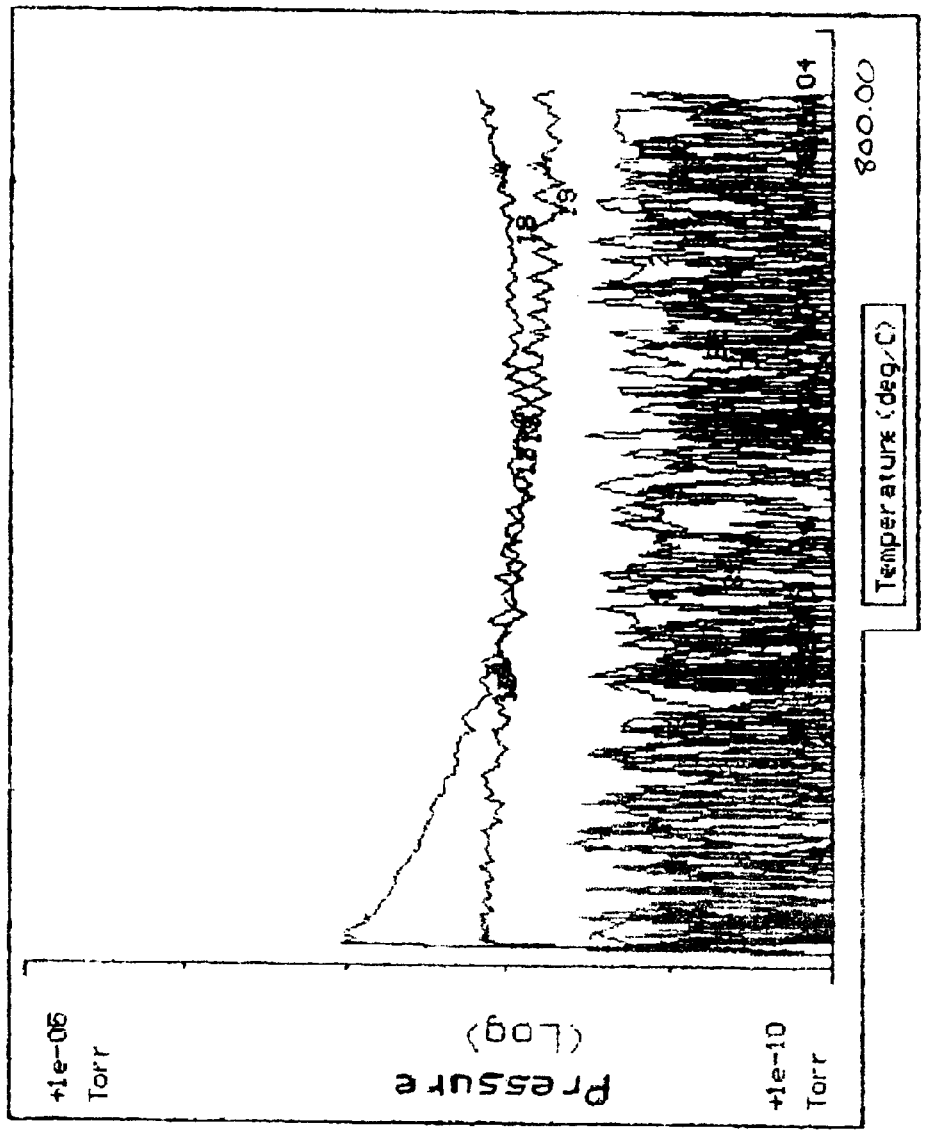
Figure 7H:
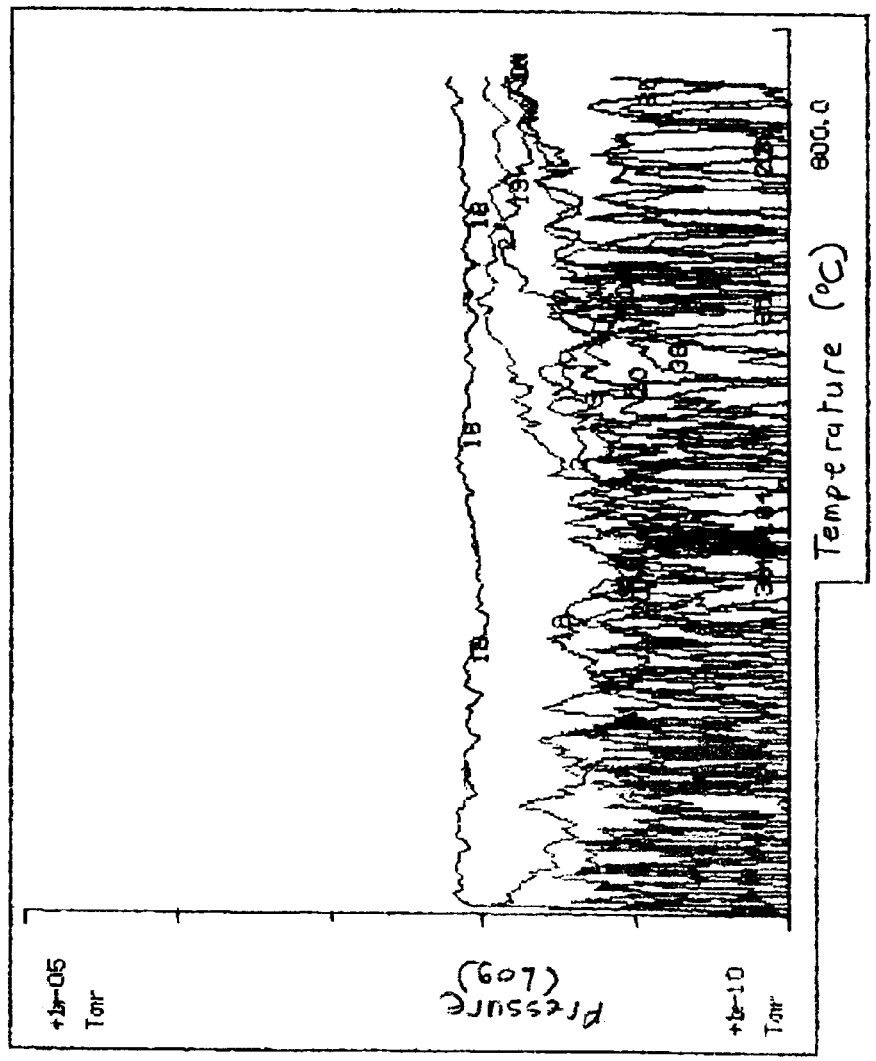
Figure 1A:
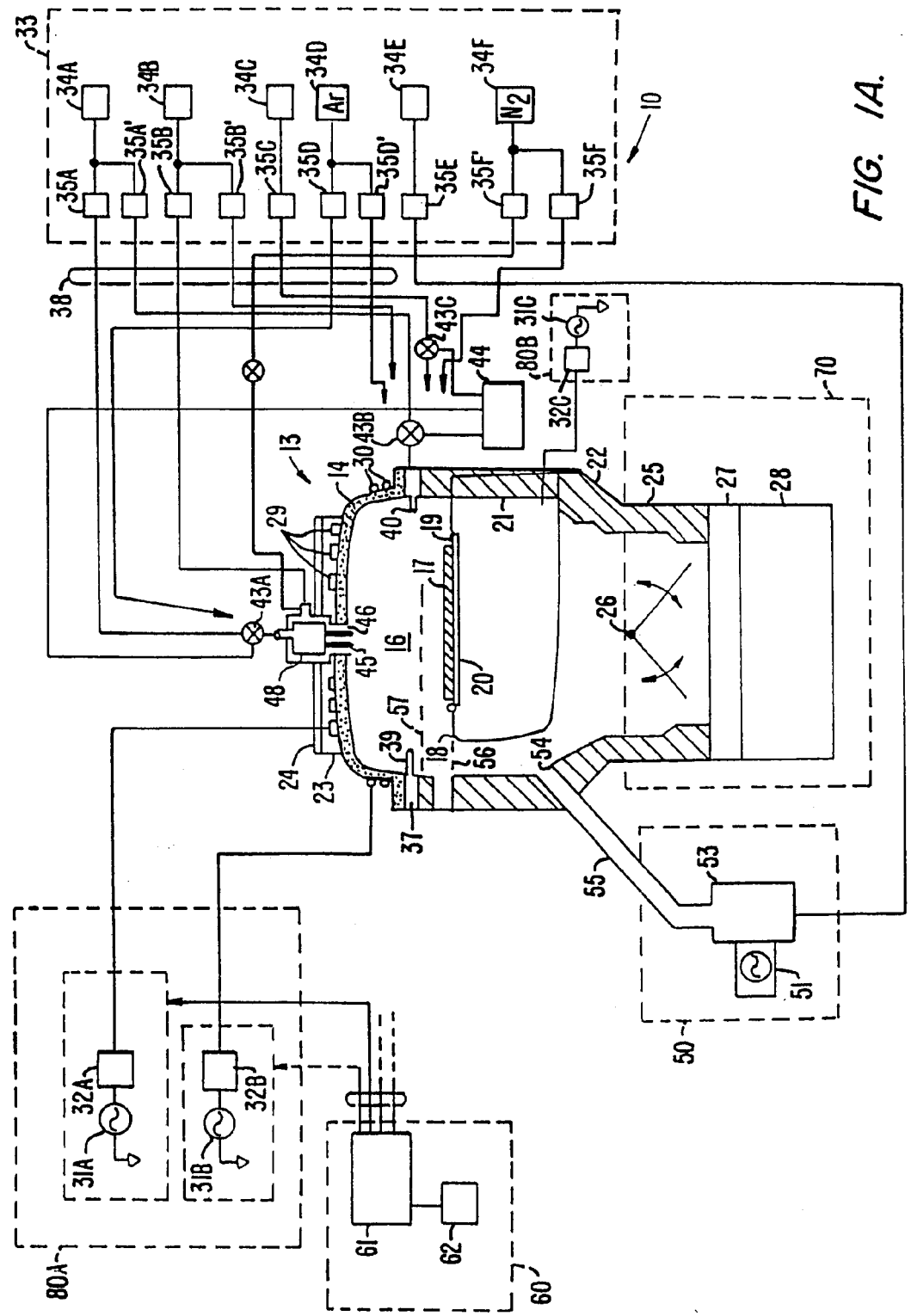
Figure 1B:
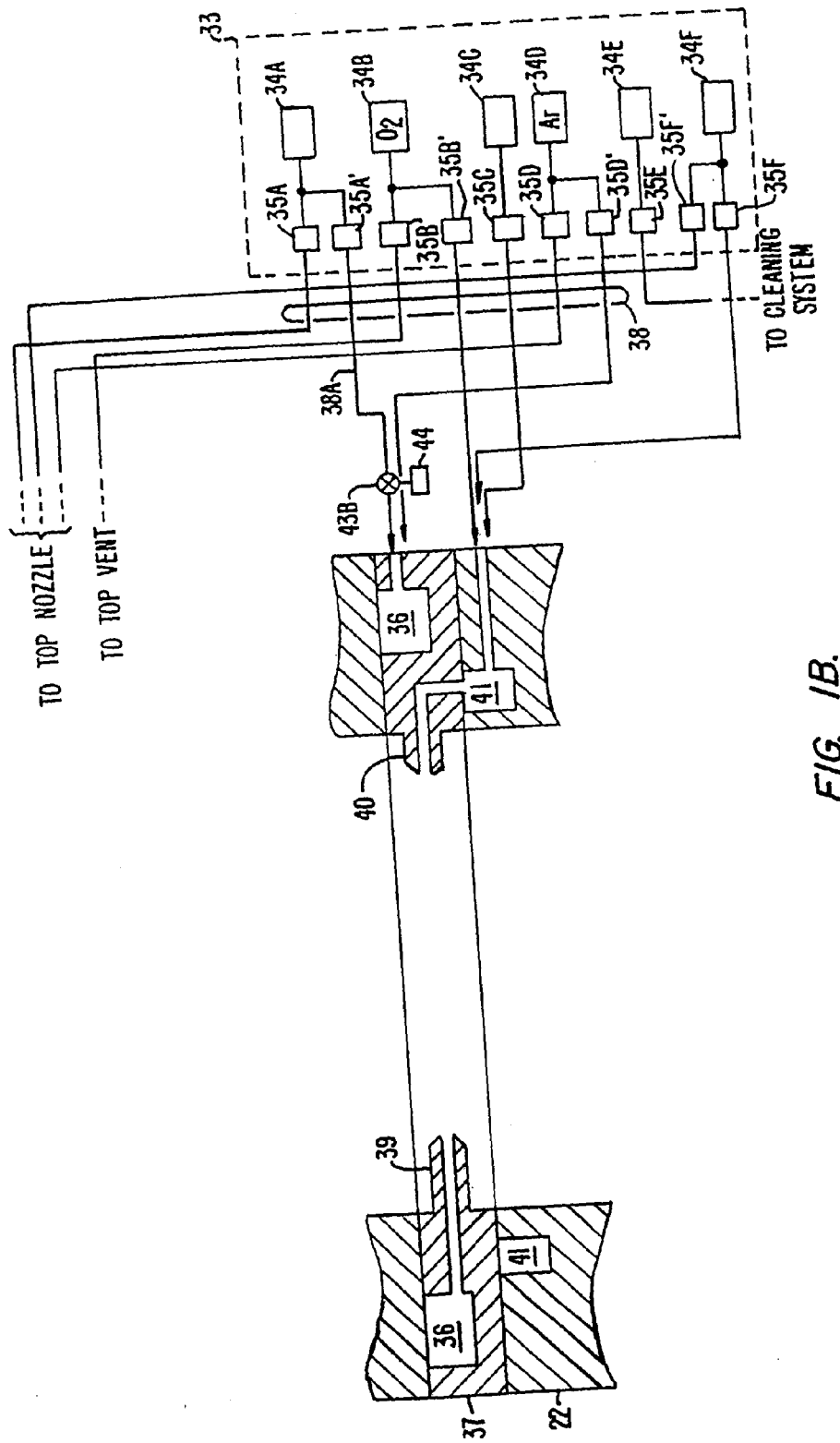
Figure 1C:
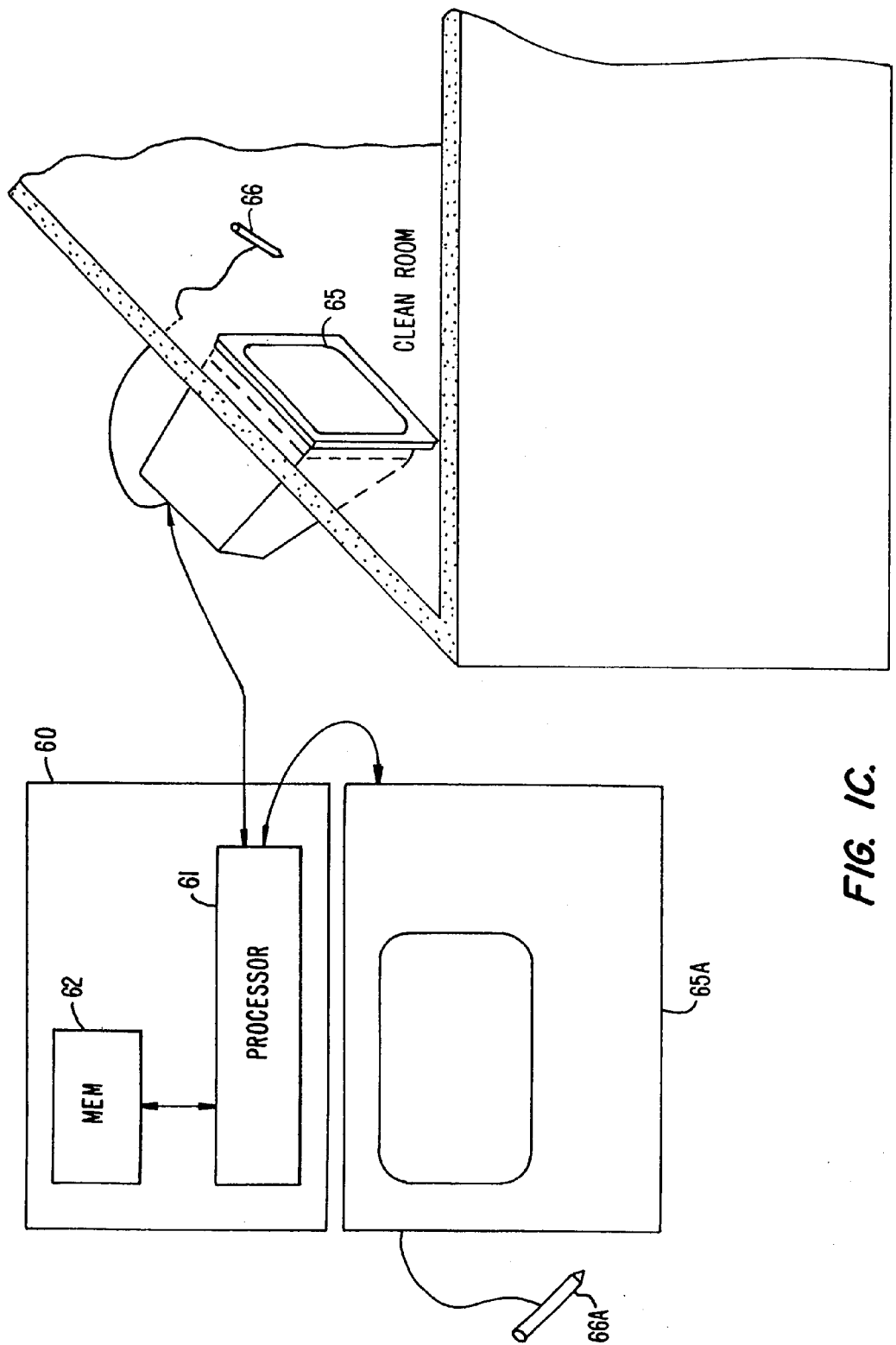
Figure 1D:
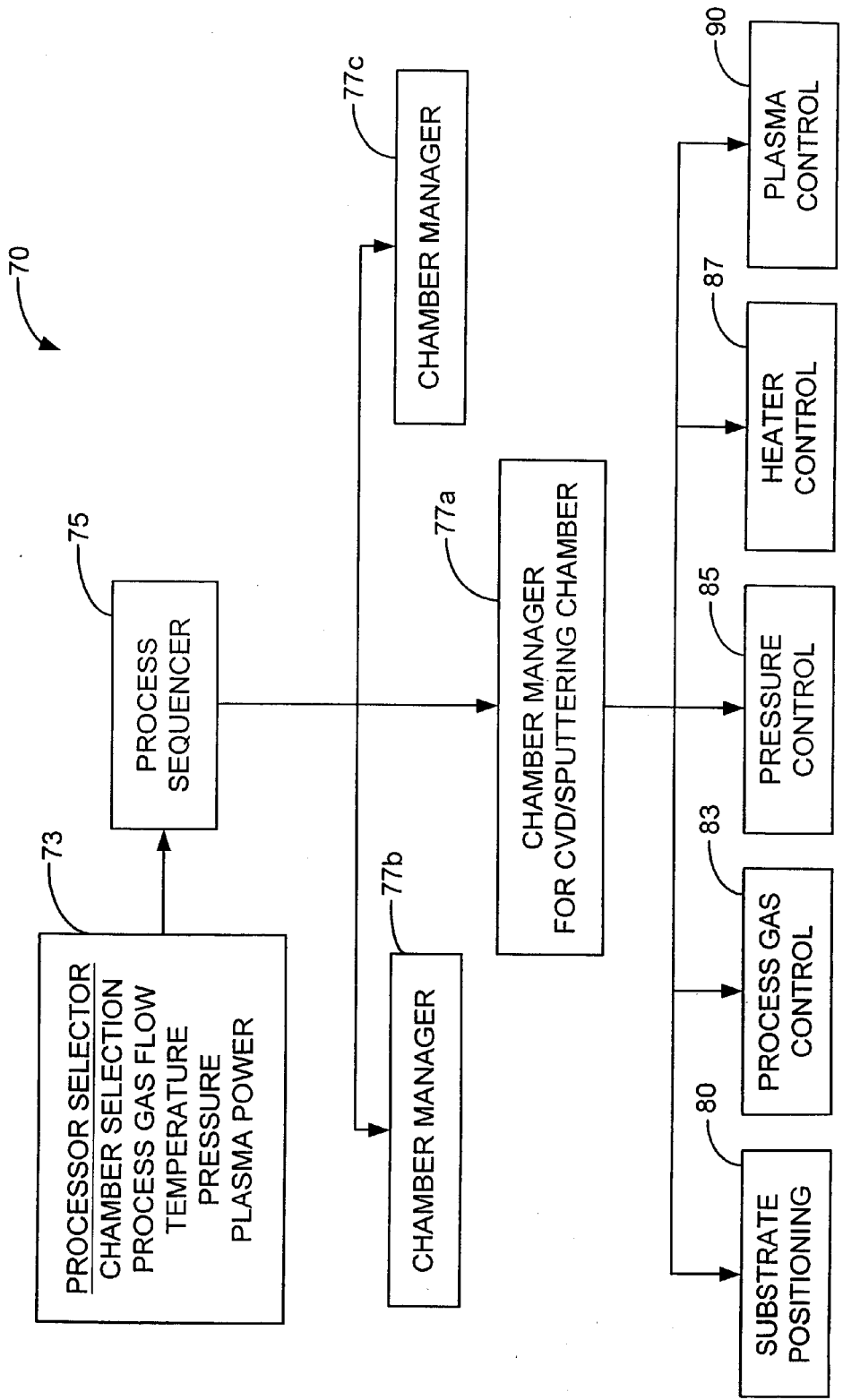
Figure 2:
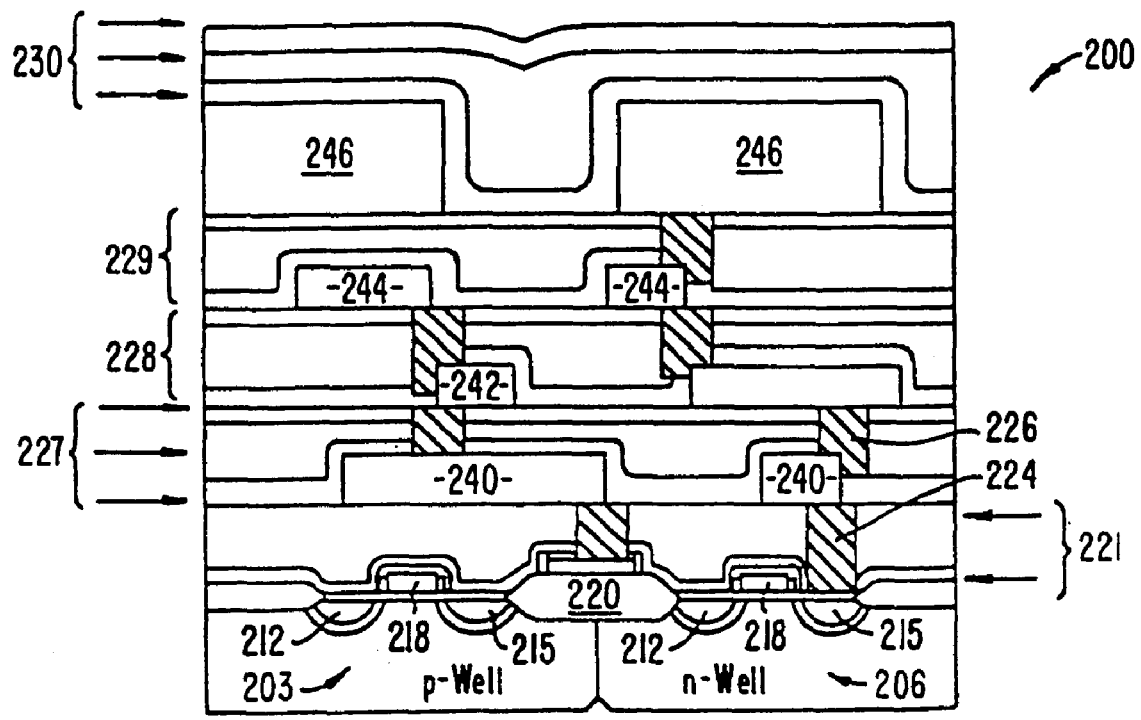
Figure 3:
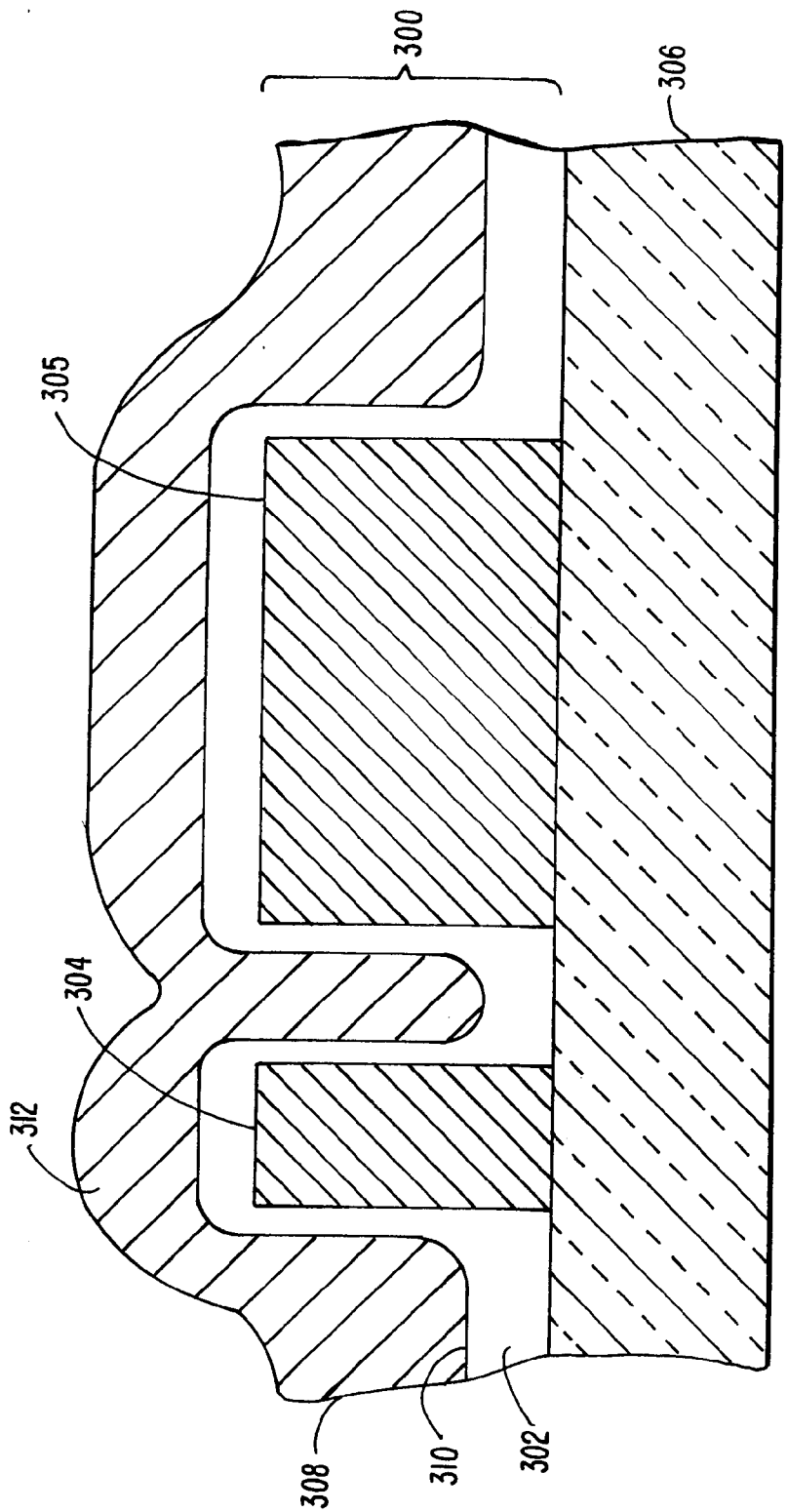
Figure 4:
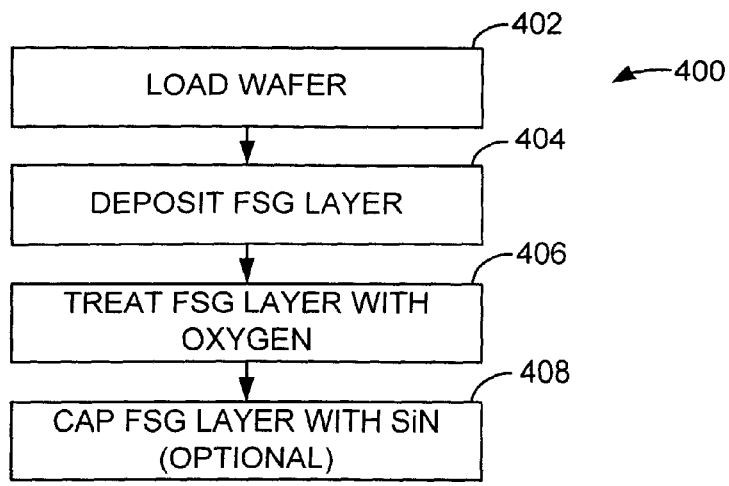
Figure 5:
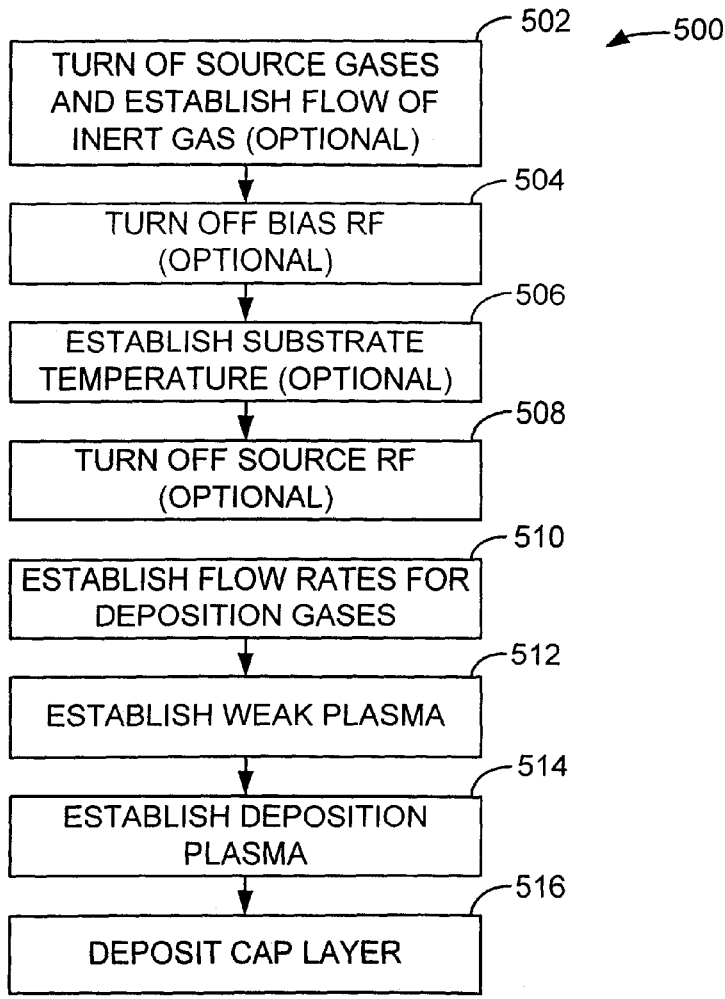
Figure 6A:
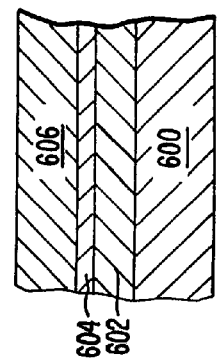
Figure 6B:
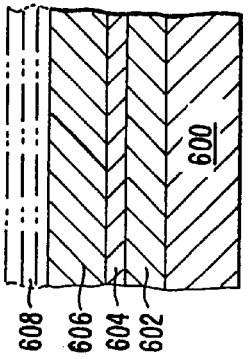
Figure 6C:
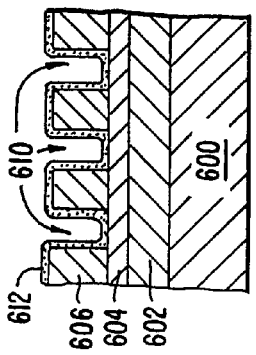
Figure 6D:
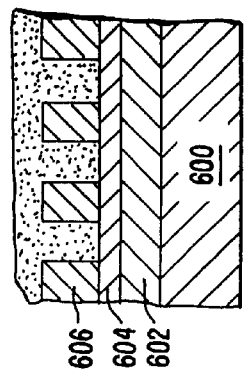
Figure 6E:
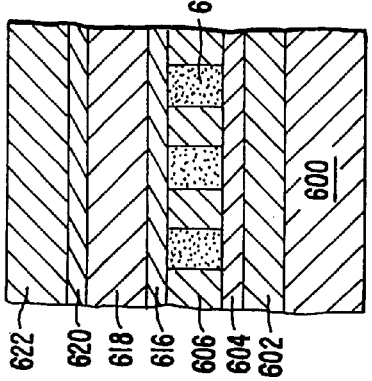
Figure 6F:
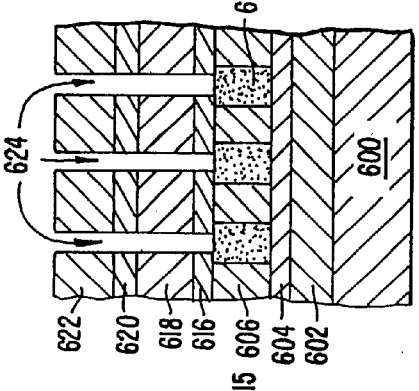
Figure 6G:
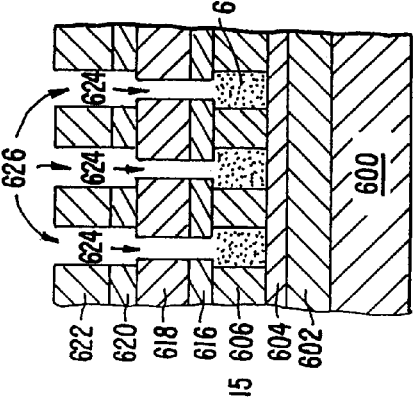
Figure 6H:
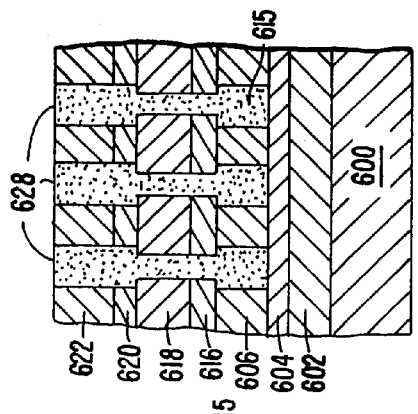
Figure 7A:
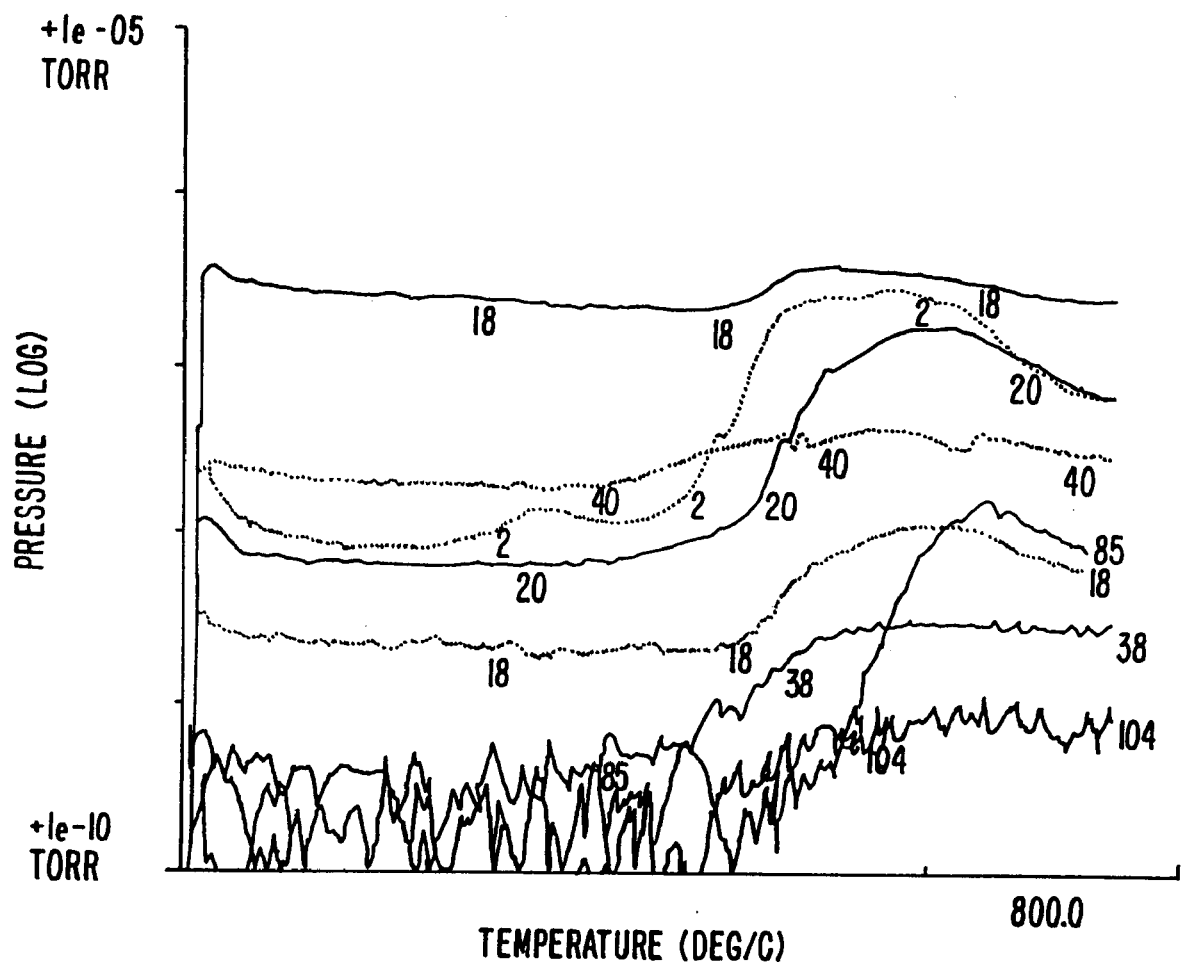
Figure 7B:
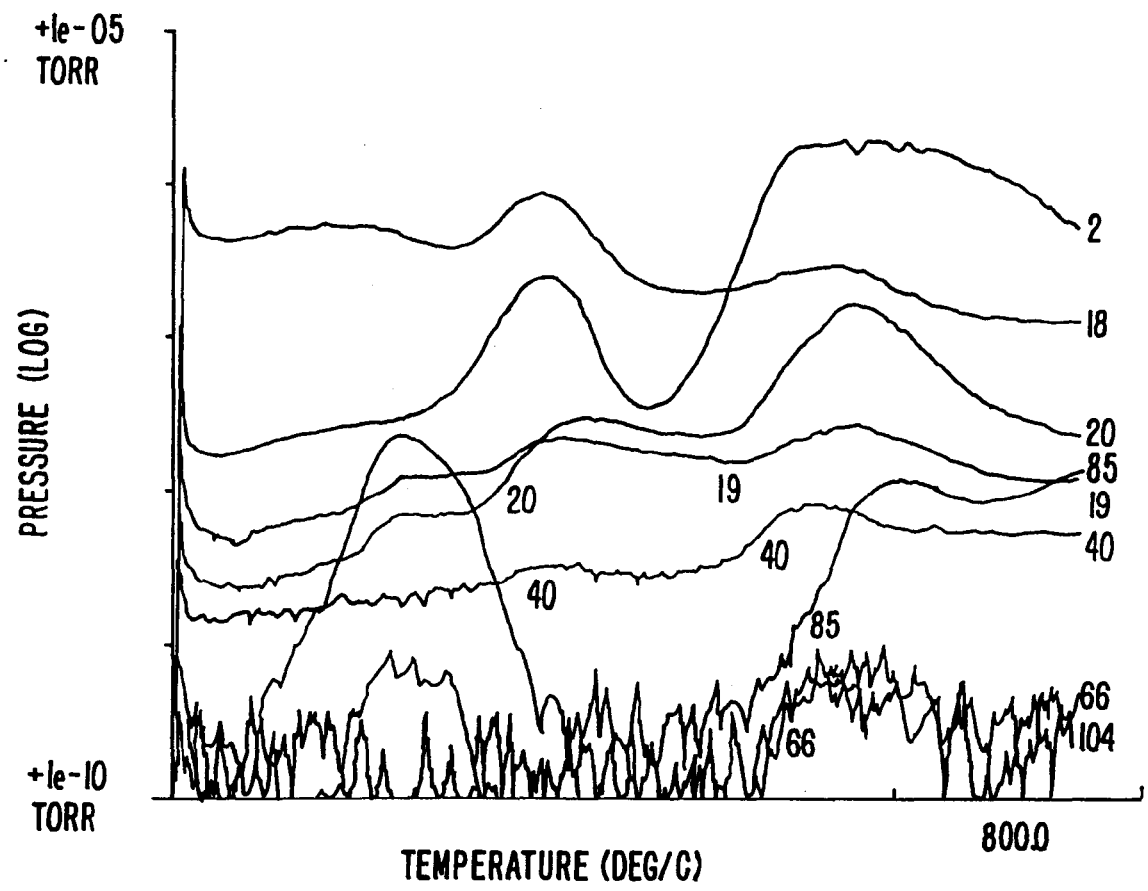
Figure 7C:
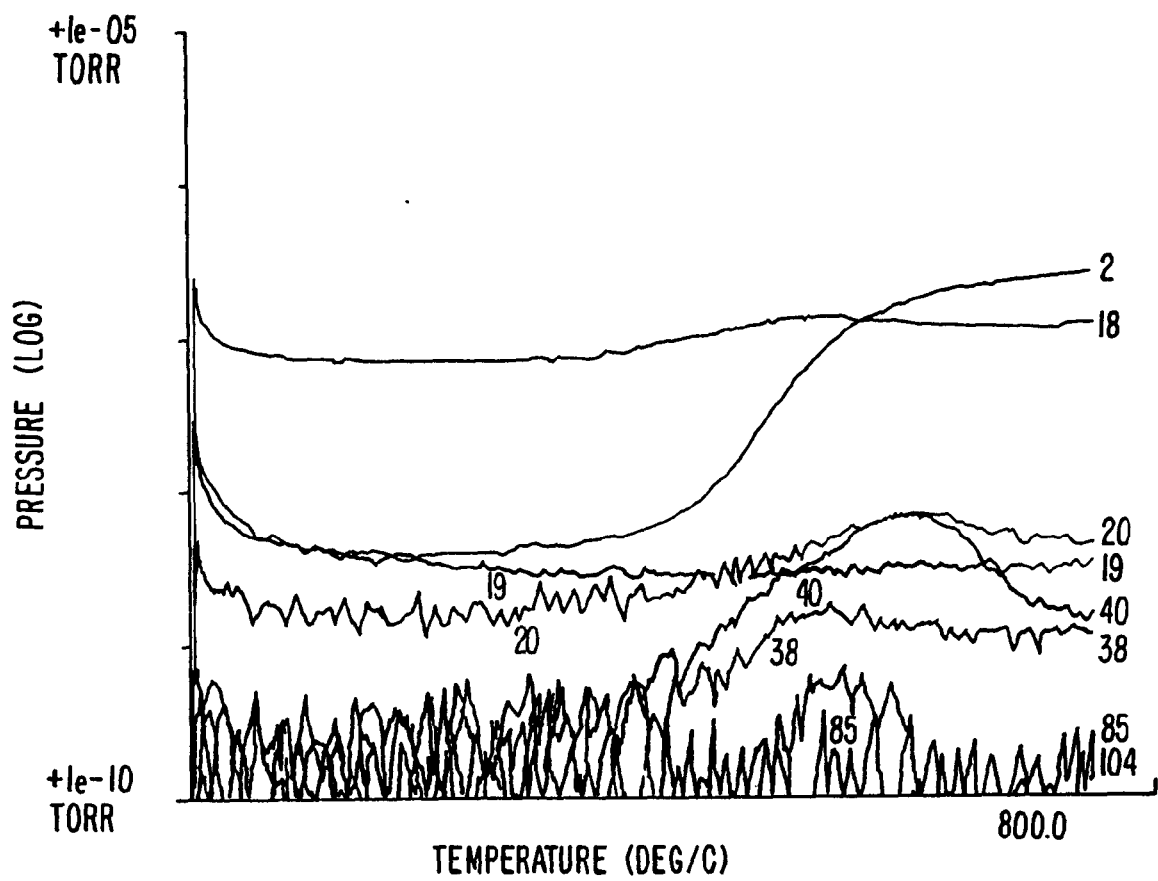
Figure 7D:
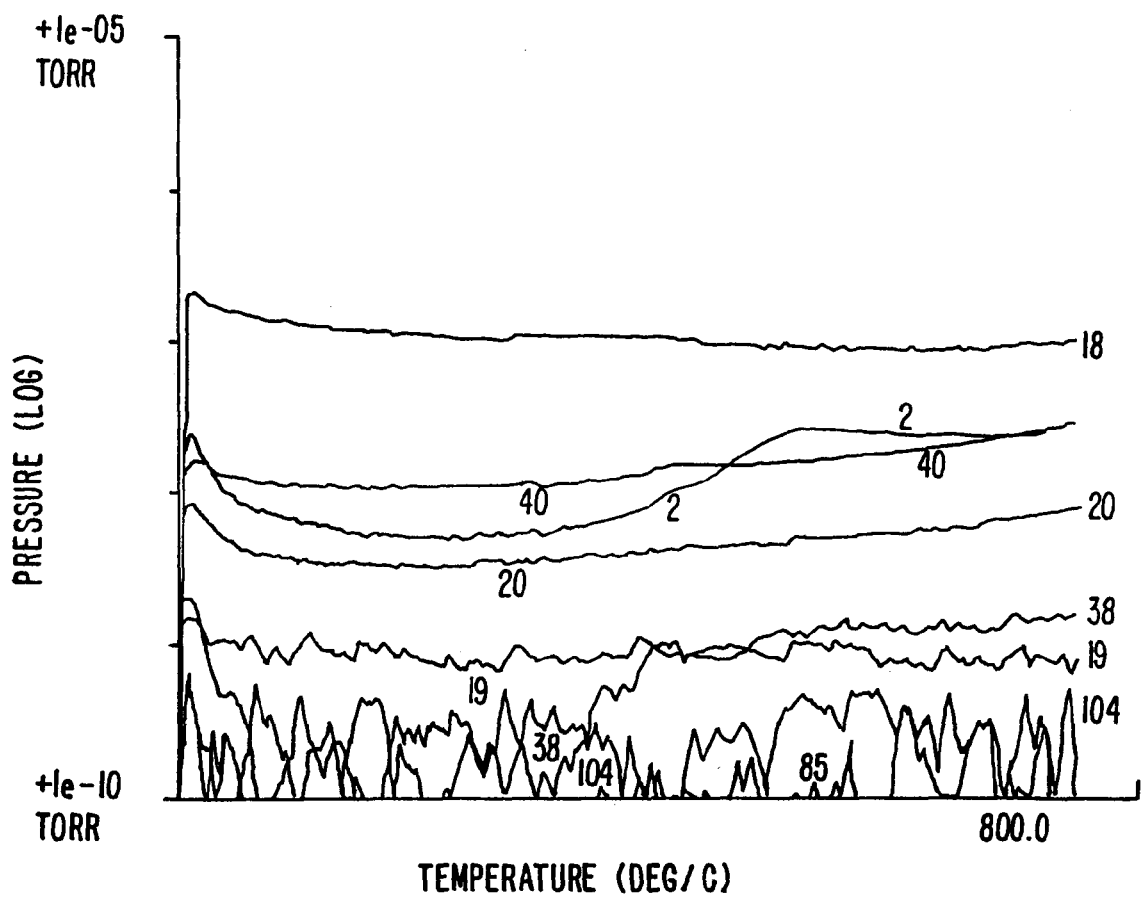
Figure 7E:
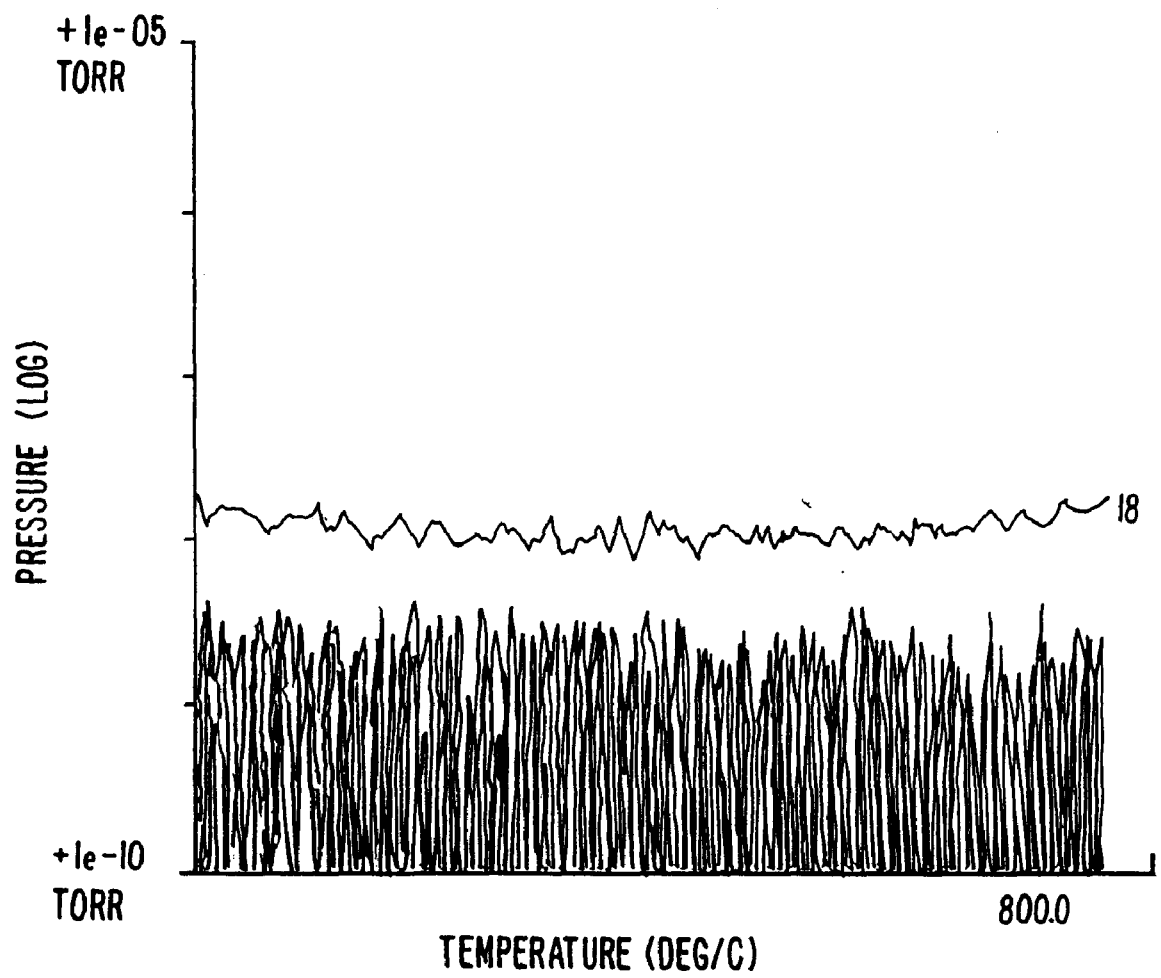

In the first and second experiments, FSG layers were deposited without oxygen treatment or silicon nitride capping. The FSG layer in the first experiment was deposited with a content of fluorine of about 3.6% PHR. The TDS spectra for the first experiment are depicted in FIG. 7(a). The FSG layer in the second experiment was deposited with a fluorine content of about 7.1% PHR. The TDS spectra for the second experiment are depicted in FIG. 7(b). Fluorine concentrations were determined by conventional Fourier transform infrared (FTIR) measurements. The FSG layer in the third experiment was deposited in a two step process with oxygen treatment, as described above. However, no silicon nitride cap layer was deposited over the FSG. The TDS spectra for the third experiment are depicted in FIG. 7(c). In the fourth experiment, and FSG layer was deposited in a two step process with oxygen treatment, as described above and subsequently capped with silicon nitride using the low-pressure strike. The TDS spectra for the fourth experiment are depicted in FIG. 7(d).

Figure 7F:
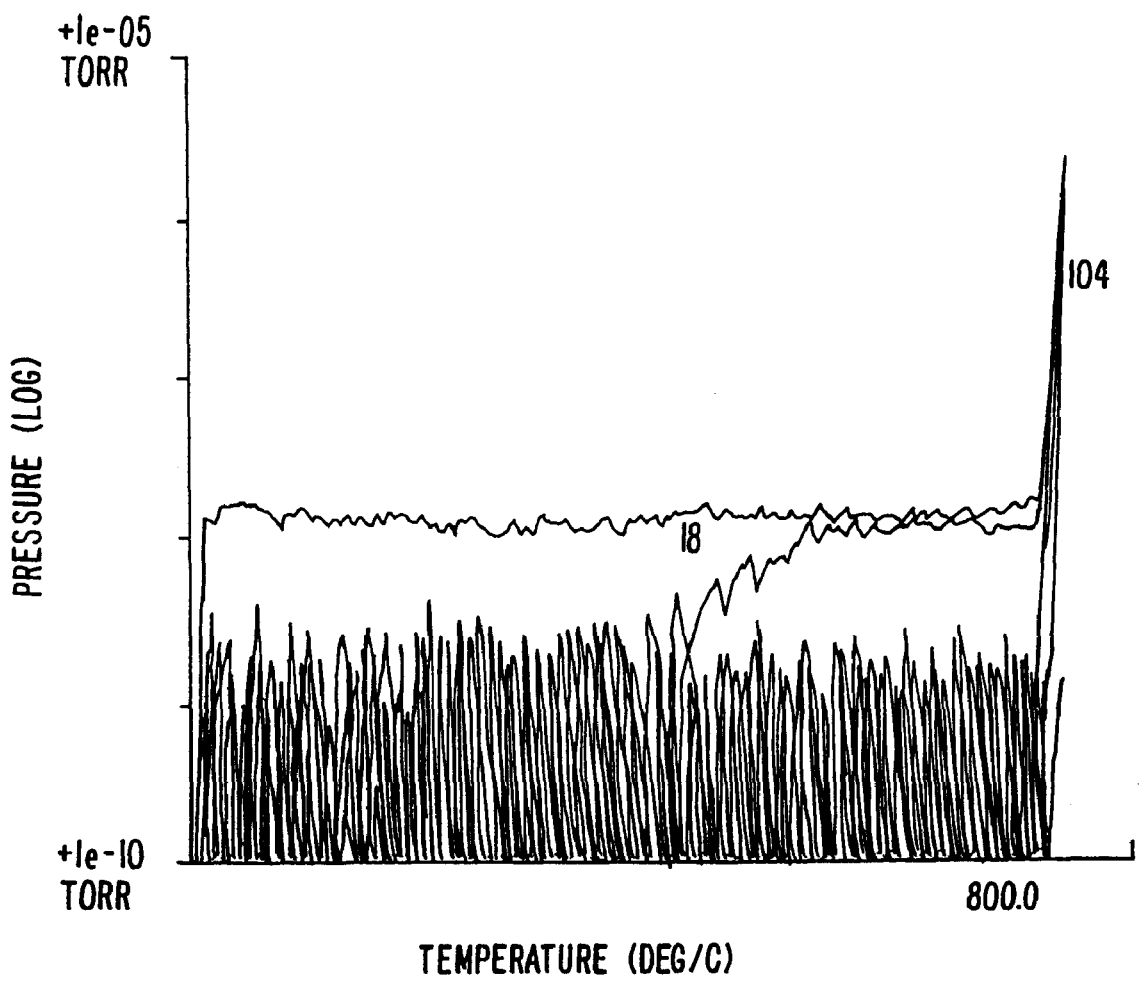
Figure 7G:
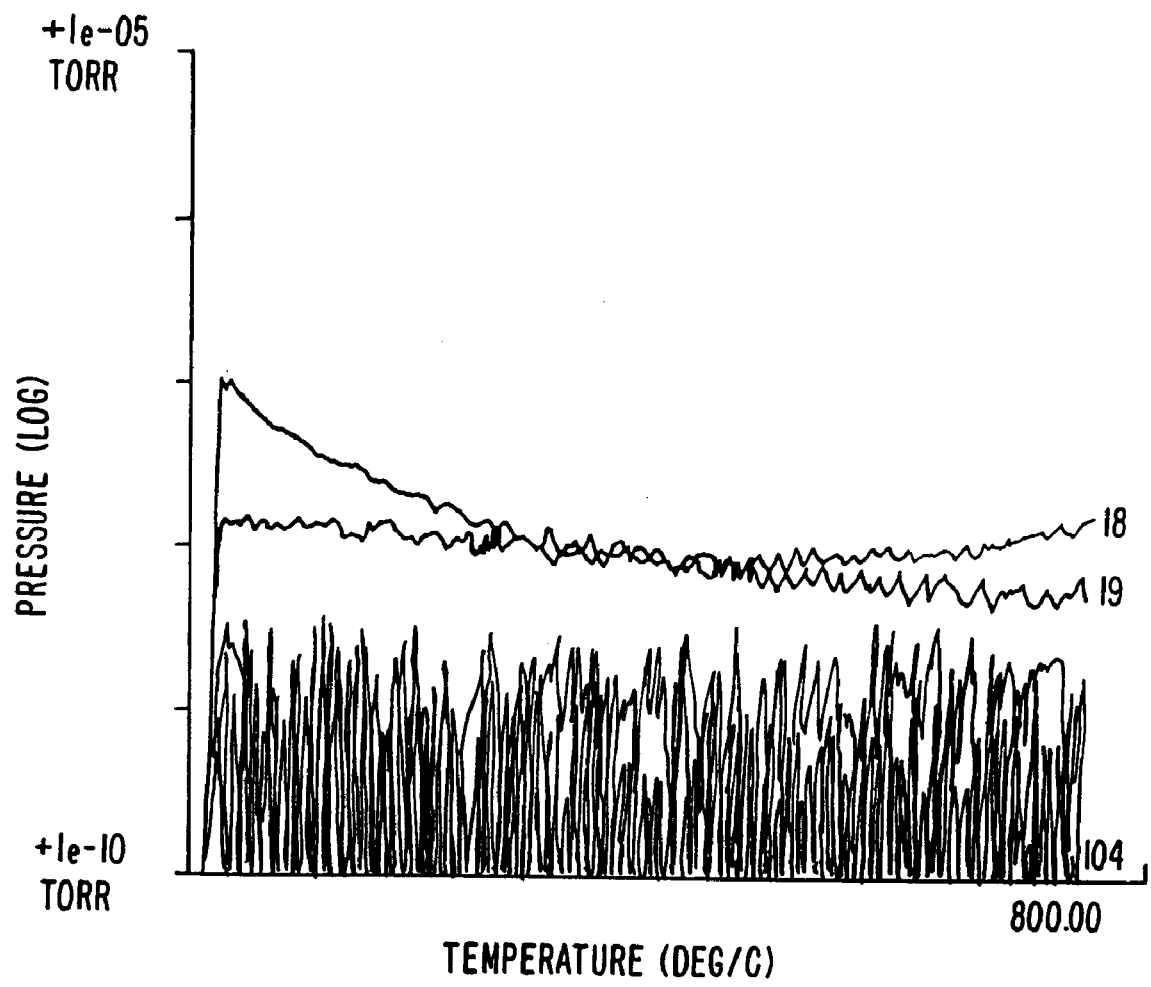
Figure 7H:
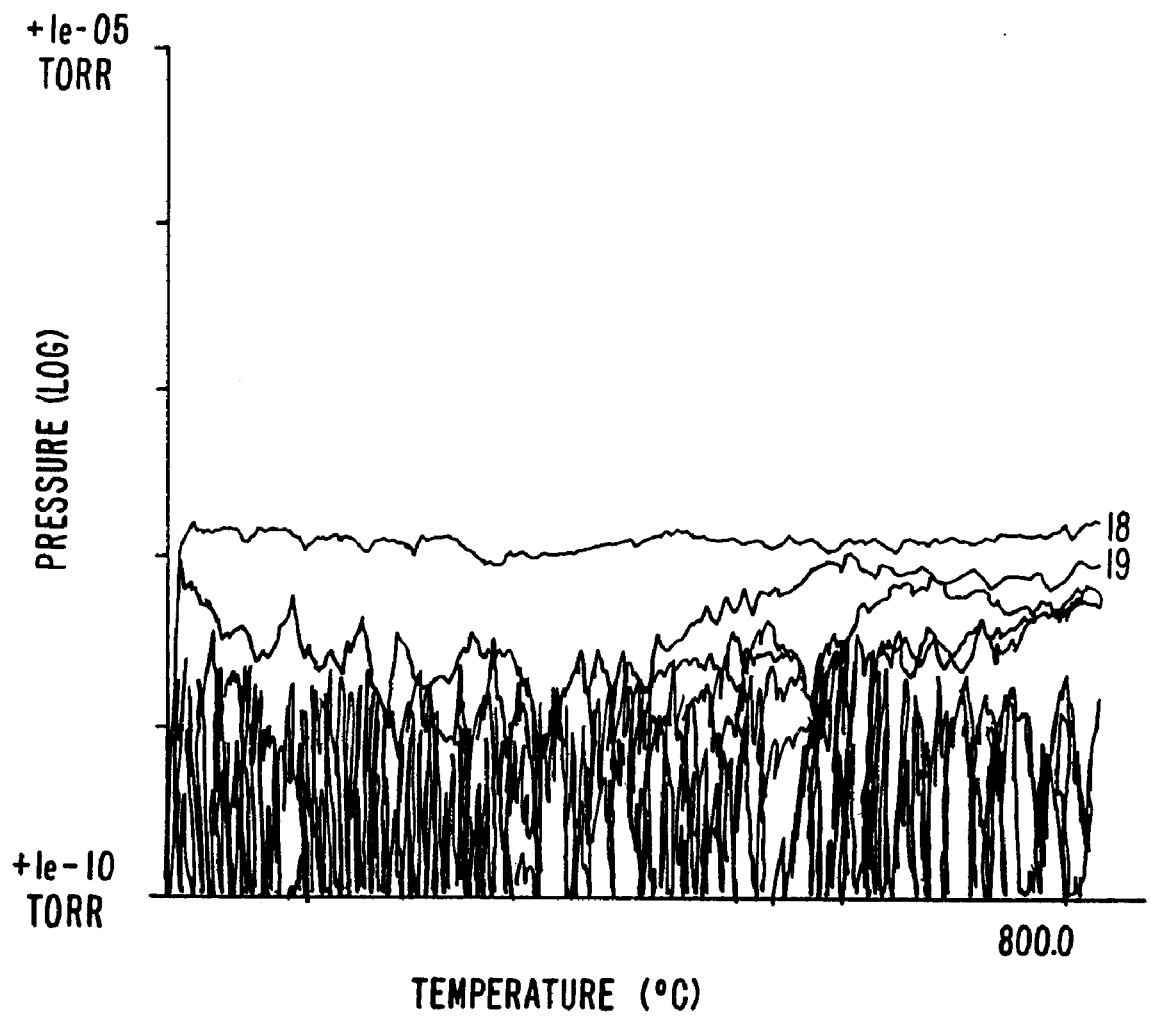

The next two experiments compared the effect of the oxygen treatment on FSG films that were capped with silicon nitride using the low-pressure strike. For each of these two experiments, TDS sample tubes were heated to 1000°, without wafer samples, to determine the background signal from gases desorbing from the sample tube. In the fifth and sixth experiments, FSG layers were deposited and capped with silicon nitride according the method described above. The fluorine concentration in the FSG layers, as measured by % PHR, was approximately 8.0% in the fifth and sixth experiments. The film in the fifth experiment was deposited without oxygen treatment. The background TDS spectra for the fifth experiment are depicted in FIG. 7(e). The sample TDS spectra TDS spectra for the fifth experiment are depicted in FIG. 7(f). The sixth experiment differed from the fifth in that the FSG film in the sixth experiment was treated with oxygen before a cap layer of silicon nitride was deposited on top of the FSG layer in accordance with the low pressure strike method described above. The background TDS spectra for the sixth experiment are depicted in FIG. 7(g). The sample TDS spectra for the fifth experiment are depicted in FIG. 7(h).

The TDS spectra illustrated in the graphs depicted in FIGS. 7(a)–7(h) are plots of the partial pressure for various gases as a function of wafer temperature. In FIGS. 7(a)–7(h), each gas is identified by its atomic mass number as indicated in Table I below.

TABLE I

| MASS NUMBER | GAS |
|---|---|
| 2 | Hydrogen ($H_2$) |
| 18 | Water vapor ($H_2O$) |
| 19 | Fluorine (F) |
| 20 | Hydrogen Fluoride (HF) |
| 38 | Fluorine ($F_2$) |
| 40 | Argon (Ar) |
| 85 | Trifluorosilane ($SiF_3$) |
| 104 | Tetrafluorosilane ($SiF_4$) |

In Experiments 1–6, sample tubes containing samples of wafers were slowly heated to about 800° C. and the partial pressures of the gases desorbed was determined using a mass spectrometer. Note that, without the silicon nitride cap layer, there is a considerable amount of outgassing, particularly at masses 20 and 19. The TDS plots for the various gases in FIGS. 7(a) and 7(b) suggest that the outgassing is more severe for a higher content of fluorine in the FSG film. Furthermore, the outgassing is strongly temperature dependent. Note that both the amount outgassing and the temperature dependence are more strongly pronounced in FIG. 7(b). This is believed to be due to the higher fluorine content in the FSG layer deposited in the fifth experiment. FIG. 7(c) indicates that the oxygen treatment film reduces the amount of outgassing somewhat, indicating that the FSG film is relatively stable even without the silicon nitride cap layer. Note that in FIG. 7(c) there is little significant outgassing of fluorine as indicated by the behavior of the plots for mass numbers 19, 20, 38, 85 and 104 when compared to FIGS. 7(a) and 7(b). More importantly, what little fluorine outgassing there is in FIG. 7(c) is only weakly dependent on temperature. The TDS plots in FIG. 7(d) indicate that the film is even more stable with the silicon nitride layer than without it. There is even less outgassing of fluorine in FIG. 7(d) than in FIG. 7(c). Furthermore what little outgassing there is exhibits almost no significant dependence on temperature.

FIGS. 7(e) and 7(f) indicate that, even without oxygen treatment, the capped FSG film evinces little or no outgassing up to about 500° C. FIG. 7(f) shows that, aside from water vapor (mass 18), which is present in the background spectra of FIG. 7(e), the signals for the various gases are indistinguishable from the noise level. The sharp spike at mass 104 in at about 800° C. if FIG. 7(f) is believed to be an artifact of the experiment. Similarly, FIGS. 7(g) and 7(h) suggest that the level of outgassing is about the same for a film that has been treated with oxygen as one that has not been treated with oxygen. Furthermore, whatever outgassing may have occurred in FIGS. 7(g) and 7(h) was insufficient to cause delamination of the overlying silicon nitride cap on the corresponding FSG films.

Adhesion of the films was tested by thermal cycling. In each cycle the wafers were heated to 400° C. under nitrogen ambient. After six cycles, the wafers were inspected for delamination of the film. If no delamination was observed, the wafer passed. Any delamination constituted a failure of the adhesion test. Adhesion test results for the films of FIGS. 7(a)–7(d) and 7(h) are summarized in Table II below.

TABLE II

| EXPERIMENT | FIG. # | AT % F | $O_2$ | $SI_XN_Y$ | ADHESION (P/F) |
|---|---|---|---|---|---|
| 1 | 7(a) | 5 | N | N | PASS |
| 2 | 7(b) | 10 | N | N | FAIL |
| 3 | 7(c) | 10 | Y | N | PASS |
| 4 | 7(d) | 10 | Y | Y | PASS |
| 6 | 7(h) | 10 | Y | Y | PASS |

To quantitatively compare the effect of the oxygen treatment, four wafers were prepared with oxygen treatment and silicon nitride caps and four wafers were prepared silicon nitride caps but without oxygen treatment. Studd pull measurements were performed on a sample from each wafer. The results are listed in Table III below.

TABLE III

| SAMPLE | $O_2$ Included | FORCE (LBS) | STRESS (PSI) |
|---|---|---|---|
| 1 | N | 101.92 | 11548.88 |
| 2 | N | 88.16 | 9990.05 |
| 3 | N | 96.95 | 10986.34 |
| 4 | N | 103.59 | 11738.65 |
| 5 | Y | 107.90 | 12226.63 |
| 6 | Y | 106.58 | 12077.52 |
| 7 | Y | 106.16 | 12030.08 |
| 8 | Y | 98.57 | 11169.33 |

Note that, on average, the silicon nitride capped FSG films deposited with oxygen treatment exhibit a higher stability (as measured by film stress) than the silicon nitride capped FSG films deposited without oxygen treatment. Although the difference is not dramatic, it is, nonetheless, statistically significant.

The results show that the method of the present invention can deposit stable, strongly adhering FSG films having fluorine concentration of 7% or greater as measured by % PHR. Furthermore, in the present integration scheme, both the FSG film and silicon nitride cap layer can be deposited in-situ without removing the substrate from the deposition chamber, thereby desirably enhancing throughput. Such films also find use in premetal dielectric (PMD) and intermetal dielectric (IMD) applications. It should be pointed out that the low-pressure strike solves a major problem associated with depositing layers less than about 1000 Å thick using HDP-CVD. Thin layers deposited by low-pressure strike find additional applications as barrier layers in gap-fill processes.

The invention has now been described with reference to the preferred embodiments and specific examples. Alternatives and substitutions will now be apparent to persons of skill in the art. Accordingly, it is not intended to limit the invention except as provided in the appended claims.

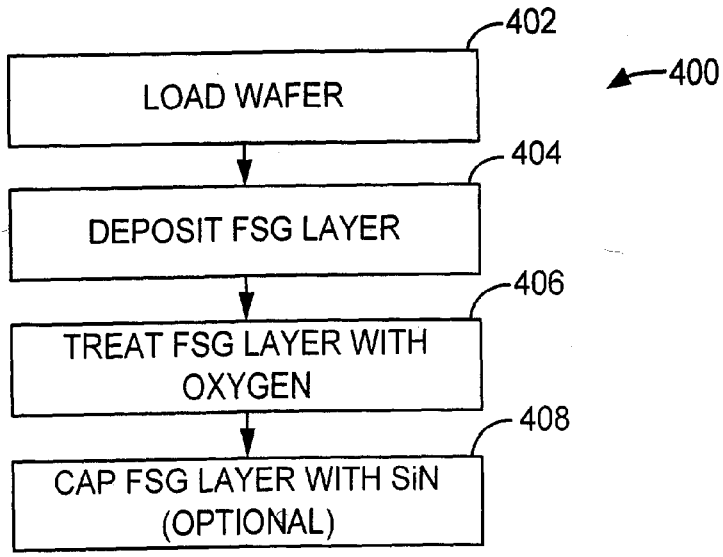

What is claimed is:

1. A method of depositing a multilayer dielectric film on a substrate, said method comprising:
   depositing a fluorosilicate glass (FSG) layer on the substrate;
   after depositing said FSG layer, exposing said FSG layer to an oxygen environment in a manner that stabilizes the FSG layer by reacting the oxygen with the fluorine to reduce the fluorine to oxygen ratio of the FSG layer; and
   thereafter, depositing a silicon nitride layer on said FSG layer.

2. The method of claim 1 wherein said FSG layer contains an atomic concentration of fluorine that is greater than about 7.0% as measured by % peak height ratio (% PHR).

3. The method of claim 1 wherein said oxygen environment is an oxygen plasma.

4. The method of claim 1 wherein said depositing a fluorosilicate glass layer includes:
   flowing a silicon containing gas, a fluorine containing gas and an oxygen containing gas into a deposition chamber;
   generating a plasma with said silicon containing, fluorine containing, and oxygen containing gases; and
   depositing said fluorosilicate glass layer using said plasma.

5. The method of claim 1 wherein said FSG layer is deposited using high-density plasma chemical vapor deposition (HDP-CVD).

6. The method of claim 1 wherein said silicon nitride layer is deposited by:
   flowing one or more process gases to a deposition chamber;
   thereafter, performing a low pressure strike to initiate a plasma with said one or more process gases; and
   depositing said silicon nitride layer using said plasma.

7. The method of claim 6 wherein said low pressure strike includes:
   establishing flows of said one or more process gases such that a pressure in the deposition chamber is between 5 and 100 millitorr;
   turning on a bias voltage for a period of time sufficient to establish a weak plasma in the deposition chamber;
   after establishing said weak plasma, turning on a source voltage; and
   after turning on said source voltage, turning off said bias voltage while leaving said source voltage turned on.

8. The method of claim 7 wherein said weak plasma is a capacitively coupled plasma.

9. A method of depositing a dielectric film on a substrate, comprising:
   depositing a fluorosilicate glass (FSG) layer on the substrate with a first atomic ratio of fluorine to oxygen;
   after depositing said FSG layer, exposing said FSG layer to an oxygen environment in a manner that stabilizes the FSG layer by reacting the oxygen with the fluorine to reduce the fluorine to oxygen ratio of the FSG layer;
   thereafter, depositing a silicon nitride layer on top of said FSG layer; and
   wherein said FSG deposition, oxygen environment exposure, and silicon nitride deposition are all performed in the same chamber without removing the substrate from said same chamber.

10. The method of claim 9 wherein said silicon nitride layer is less than about 1000 Å in thickness.

11. The method of claim 9 wherein said FSG layer is deposited using high-density plasma chemical vapor deposition.

12. The method of claim 11 wherein said FSG layer has a fluorine concentration of greater than about 7.0% as measured by % peak height ratio.

13. The method of claim 11 wherein said FSG layer has a fluorine concentration of between about 7.0% and 8.0%, as measured by % peak height ratio.

14. The method of claim 11 wherein said FSG layer is exposed to said oxygen environment using an oxygen plasma.

15. The method of claim 9 wherein said depositing an FSG layer includes:
   flowing a silicon containing gas, a fluorine containing gas and an oxygen containing gas into a deposition chamber;
   applying a source voltage to the chamber and a bias voltage to the substrate to generate a high density plasma with said silicon containing, fluorine containing, and oxygen containing gases; and
   depositing said FSG layer using high-density plasma.

16. The method of claim 9 wherein said silicon nitride layer is deposited by:
   flowing a silicon containing gas and a nitrogen containing gas to a deposition chamber;
   performing a low pressure strike to initiate a plasma; and
   depositing said silicon nitride layer using said plasma.

17. The method of claim 16 wherein said low pressure strike includes:
   establishing flows of said silicon containing gas, said nitrogen containing gas, and an inert gas such that a pressure in the deposition chamber is between 1 and 100 millitorr;
   turning on a bias voltage for a period of time sufficient to establish a plasma in the deposition chamber;
   after establishing said plasma, turning on a source voltage; and
   after turning on said source voltage, turning off said bias voltage while leaving said source voltage turned on.

18. The method of claim 17 wherein said bias voltage is turned on for a bias period of up to 1.0 second.

19. The method of claim 18 wherein said source voltage and said bias voltage are both turned on for an overlapping period, said overlapping period comprising approximately a latter half of said bias period.

* * * * *

UNITED STATES PATENT AND TRADEMARK OFFICE
CERTIFICATE OF CORRECTION

PATENT NO.    : 6,372,291 B1
DATED         : April 16, 2002
INVENTOR(S)   : Zhong Qiang Hua et al.

It is certified that error appears in the above-identified patent and that said Letters Patent is hereby corrected as shown below:

Drawings,
The title page should be deleted and substitute therefore the attached title page.
Drawing sheets consisting of Figs. 1-7 should be deleted to be replaced with the attached drawing sheets.

Signed and Sealed this

Eighteenth Day of March, 2003

JAMES E. ROGAN
*Director of the United States Patent and Trademark Office*

(12) United States Patent
Hua et al.

(10) Patent No.: US 6,372,291 B1
(45) Date of Patent: Apr. 16, 2002

(54) IN SITU DEPOSITION AND INTEGRATION OF SILICON NITRIDE IN A HIGH DENSITY PLASMA REACTOR

(75) Inventors: Zhong Qiang Hua, Santa Clara; Kasra Khazeni, San Jose, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/470,561

(22) Filed: Dec. 23, 1999

(51) Int. Cl.$^7$ ................ C23C 16/00; C23C 16/08; C23C 16/24; H05H 1/24
(52) U.S. Cl. ............ 427/255.28; 427/255.39; 427/255.393; 427/569; 427/578; 427/579; 438/763
(58) Field of Search .............. 427/248.1, 255.1, 427/255.2, 255.3, 255.7, 402; 438/787, 597, 763; 156/643, 626, 646, 657, 659.1, 345

(56) References Cited

U.S. PATENT DOCUMENTS

| | | | |
|---|---|---|---|
| 4,436,584 A | * 3/1984 | Bernacki et al. | 156/634 |
| 5,661,093 A | * 8/1997 | Ravi et al. | 438/763 |
| 5,858,869 A | * 1/1999 | Chen et al. | 438/597 |
| 5,865,896 A | 2/1999 | Nowak et al. | 118/723.1 |
| 5,876,798 A | * 3/1999 | Vassiliev | 427/255.3 |
| 6,165,915 A | * 12/2000 | Jang | 438/787 |

* cited by examiner

Primary Examiner—Timothy Meeks
Assistant Examiner—William P. Fletcher, III
(74) Attorney, Agent, or Firm—Townsend & Townsend & Crew

(57) ABSTRACT

A method of depositing a dielectric film on a substrate, comprising depositing a silicon oxide layer on the substrate; and treating the dielectric layer with oxygen. A layer of FSG having a fluorine content of greater than 7%, as measured by peak height ratio, deposited by HDP CVD, is treated with an oxygen plasma. The oxygen treatment stabilizes the film. In an alternative embodiment of the invention a thin (<1000 Å thick) layer of material such as silicon nitride is deposited on a layer of FSG using a low-pressure strike. The low pressure strike can be achieved by establishing flows of the process gases such that the pressure in the chamber is between 5 and 100 millitorr, turning on a bias voltage for a period of time sufficient to establish a weak plasma, which may be capacitively coupled. After the weak plasma is established a source voltage is turned on and subsequently the bias voltage is turned off. Silicon nitride layers deposited using the low pressure strike exhibit good uniformity, strong adhesion, and inhibit outgassing from underlying layers.

19 Claims, 16 Drawing Sheets